(12) United States Patent
Higuchi et al.

(10) Patent No.: US 9,230,836 B2
(45) Date of Patent: Jan. 5, 2016

(54) SUBSTRATE TREATMENT METHOD

(75) Inventors: Ayumi Higuchi, Kyoto (JP); Yoshiyuki Fujitani, Kyoto (JP); Takemitsu Miura, Kyoto (JP); Rei Takeaki, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 720 days.

(21) Appl. No.: 13/427,370

(22) Filed: Mar. 22, 2012

(65) Prior Publication Data

US 2012/0240958 A1 Sep. 27, 2012

(30) Foreign Application Priority Data

Mar. 25, 2011 (JP) ................................. 2011-068078
Feb. 21, 2012 (JP) ................................. 2012-035298

(51) Int. Cl.
*H01L 21/67* (2006.01)
*B08B 3/04* (2006.01)
*B08B 3/10* (2006.01)
*B08B 3/02* (2006.01)

(52) U.S. Cl.
CPC .......... *H01L 21/67248* (2013.01); *B08B 3/024* (2013.01); *B08B 3/04* (2013.01); *B08B 3/10* (2013.01); *B08B 3/108* (2013.01); *H01L 21/67051* (2013.01); *H01L 21/67057* (2013.01); *H01L 21/67086* (2013.01); *H01L 21/67253* (2013.01)

(58) Field of Classification Search
CPC ............ B08B 3/04; B08B 3/024; B08B 3/10; B08B 3/108; H01L 21/67253; H01L 21/67086; H01L 21/67051; H01L 21/67057
USPC .......................... 134/2, 26, 27, 29, 32, 36, 10
See application file for complete search history.

(56) References Cited

U.S. PATENT DOCUMENTS

| | | | |
|---|---|---|---|
| 5,190,065 A | 3/1993 | Kovac et al. | 134/107 |
| 5,904,169 A | 5/1999 | Yoshitani | 137/2 |
| 6,413,355 B1 | 7/2002 | Kamikawa et al. | 156/345 |
| 2007/0034231 A1* | 2/2007 | Takahashi | 134/3 |
| 2010/0243003 A1 | 9/2010 | Ogawa | 134/34 |
| 2014/0305471 A1* | 10/2014 | Kashkoush et al. | 134/10 |

FOREIGN PATENT DOCUMENTS

| | | |
|---|---|---|
| JP | 4-196425 A | 7/1992 |
| JP | 5-038486 A | 2/1993 |
| JP | 6-053196 A | 2/1994 |
| JP | 9-90643 A | 4/1997 |
| JP | 10-154688 | 6/1998 |
| JP | 2000-005709 A | 1/2000 |
| JP | 2000-077377 A | 3/2000 |
| JP | 2000-308857 | 11/2000 |
| JP | 2002-177906 | 6/2002 |
| JP | 2002-538610 | 11/2002 |
| JP | 2004-535662 | 11/2004 |

(Continued)

*Primary Examiner* — Saeed T Chaudhry
(74) *Attorney, Agent, or Firm* — Ostrolenk Faber LLP

(57) ABSTRACT

A substrate treatment method that includes circulating a treatment liquid from a treatment vessel through a circulation path extending through a filter and a temperature controller, spouting the treatment liquid toward a substrate accommodated in the treatment vessel to recover the treatment liquid in the treatment vessel, and controlling the liquid surface level of the treatment liquid retained in the treatment vessel below the substrate held at a substrate treatment position.

6 Claims, 19 Drawing Sheets

(56) References Cited

FOREIGN PATENT DOCUMENTS

| | | |
|---|---|---|
| JP | 2006-086409 A | 3/2006 |
| JP | 2008-198689 A | 8/2008 |
| JP | 2008-198690 A | 8/2008 |
| JP | 2008-211139 A | 9/2008 |
| JP | 2009-033040 | 2/2009 |
| JP | 2009-054717 A | 3/2009 |
| JP | 2009-135218 A | 6/2009 |
| JP | 2010-225995 | 10/2010 |
| WO | WO 00/51753 A1 | 9/2000 |
| WO | WO 02/081106 A1 | 10/2002 |

* cited by examiner

SUBSTRATE TREATMENT METHOD

BACKGROUND OF THE INVENTION

1. Field of the Invention

The present invention relates to a substrate treatment apparatus and a substrate treatment method for treating a substrate with a treatment liquid. More specifically, the present invention relates to a technique for reducing the amount of particles remaining on a substrate treated with a treatment liquid. Examples of the substrate to be treated include semiconductor wafers, substrates for liquid crystal display devices, substrates for plasma display devices, substrates for organic EL devices, substrates for FED (Field Emission Display) devices, substrates for optical disks, substrates for magnetic disks, substrates for magneto-optical disks, substrates for photo masks, and substrates for solar cells. Exemplary treatment processes to be performed with the use of a treatment liquid include an etching process and a peel-off process.

2. Description of Related Art

US2007/0034231A1 discloses a substrate treatment apparatus including a treatment vessel in which an SPM solution (Sulfuric Acid/Hydrogen Peroxide/Water Mixture) is retained as a treatment liquid and substrates are accommodated for treatment. The substrate treatment apparatus is adapted to simultaneously treat a plurality of substrates by immersing the substrates in the SPM solution retained in the treatment vessel.

Further, JP2000/183011A discloses a substrate rinsing method for rinsing substrates treated with a chemical liquid by showering water onto the substrates. In this method, the substrates treated with the chemical liquid are put in a water rinsing vessel, and then moved up and down in the water rinsing vessel. Nozzles are disposed in opposed relation above an upper open end of the water rinsing vessel. While the substrates are moved up and down, water is showered downward toward surfaces of the substrates from the nozzles.

SUMMARY OF THE INVENTION

In the immersion treatment disclosed in US2007/0034231A1, the substrates are immersed in the treatment liquid retained in the treatment vessel, so that particles removed from the substrates are liable to be accumulated in the treatment vessel and adhere again to the substrates. Therefore, the particles adhering to the substrates are carried together with the substrates to downstream apparatuses in a production line. Therefore, contamination is disadvantageously spread over different lots of substrates. The term "lot" herein means a batch of substrates to be treated at a time in the substrate treatment apparatus.

In the showering treatment disclosed in JP2000/183011A, on the other hand, water used for cleaning the substrates is drained to be discarded. Therefore, particles contained in the used water are prevented from adhering again to the substrates.

However, a treatment space in which the substrates to be subjected to the showering treatment are placed is not filled with the treatment liquid, so that particles present in the atmosphere of the treatment space are liable to adhere to the substrates.

Although not described in JP2000/183011A, the showering treatment encounters a problem when a higher-temperature treatment liquid is used for the treatment of the substrates as in the SPM treatment. That is, the showered treatment liquid is liable to be deprived of heat by the atmosphere and the substrates to be thereby cooled to a lower temperature. This makes it difficult to accurately control the temperature of the treatment liquid observed when the treatment liquid reaches the substrates, preventing uniform treatment of the substrates.

The present invention provides a substrate treatment apparatus which treats a substrate with a treatment liquid. The substrate treatment apparatus includes: a treatment vessel in which the treatment liquid is retained and the substrate is accommodated; a treatment liquid supply unit which supplies the treatment liquid into the treatment vessel; a chamber which encloses the treatment vessel; a substrate holding unit which transports the substrate between a substrate transfer position at which the substrate is transferred into and out of the treatment vessel and a substrate treatment position at which the substrate is treated in the treatment vessel, the substrate holding unit including a substrate holding portion which holds the substrate; a first circulation unit including a filter which cleans the treatment liquid retained in the treatment vessel, a temperature controller which controls the temperature of the treatment liquid retained in the treatment vessel, and a first spouting portion which spouts the treatment liquid toward the substrate accommodated in the treatment vessel, the first circulation unit being adapted to circulate the treatment liquid from the treatment vessel through a first circulation path extending through the filter and the temperature controller back into the treatment vessel; and a control unit which controls the liquid surface level of the treatment liquid retained in the treatment vessel at a first liquid surface level, and spouts the treatment liquid toward the substrate held at the substrate treatment position from the first spouting portion in air by causing the first circulation unit to circulate the treatment liquid from the treatment vessel, the first liquid surface level being set lower than the first spouting portion and lower than the substrate held at the substrate treatment position so as to prevent the treatment liquid retained in the treatment vessel from contacting the substrate held at the substrate treatment position.

According to the present invention, the treatment liquid is supplied into the treatment vessel by the treatment liquid supply unit, then circulated by the first circulation unit, and spouted toward the substrate from the first spouting portion in air. At this time, the liquid surface level of the treatment liquid retained in the treatment vessel is controlled at the first liquid surface level set lower than the substrate, thereby preventing the substrate from contacting the treatment liquid retained in the treatment vessel. Thus, particles contained in the treatment liquid after the substrate treatment are prevented from adhering again to the substrate.

Since the amount of the treatment liquid retained in the treatment vessel is smaller than in the immersion substrate treatment, heat accumulated in the treatment liquid is more easily released. Further, the liquid surface level in the treatment vessel is lower, so that a greater area of the treatment vessel contacts to the ambient atmosphere of the treatment vessel. Therefore, the heat of the treatment liquid retained in the treatment vessel is more easily released via the treatment vessel. Correspondingly, the treatment liquid is more liable to suffer from temperature reduction. Further, the treatment liquid spouted from the first spouting portion is exposed to the internal atmosphere of the treatment vessel immediately after being spouted from the first spouting portion, so that the temperature of the treatment liquid is easily reduced by absorption of the heat by the internal atmosphere of the treatment vessel.

To cope with this, the first circulation unit is provided, which circulates the treatment liquid through the first circulation path extending through the temperature controller in the present invention. Thus, the temperature of the treatment liquid retained in the treatment vessel can be controlled at a constant level by the circulation of the treatment liquid. Further, the treatment vessel is provided in the chamber, so that reduction in the surface temperature of the treatment vessel can be suppressed. This suppresses reduction in the internal atmosphere temperature of the treatment vessel. Even if the treatment liquid is spouted from the first spouting portion in air in the treatment vessel, the heat of the treatment liquid is substantially prevented from being absorbed by the internal atmosphere of the treatment vessel. This ensures uniform treatment of the substrate.

According to one embodiment of the present invention, the first spouting portion includes a first nozzle which spouts the treatment liquid toward the substrate from a position immediately above the substrate held at the substrate treatment position by the substrate holding unit, a second nozzle which spouts the treatment liquid toward the substrate from a position obliquely above the substrate held at the substrate treatment position by the substrate holding unit, a third nozzle which spouts the treatment liquid toward the substrate from a position located laterally of the substrate held at the substrate treatment position by the substrate holding unit, and a fourth nozzle which spouts the treatment liquid toward the substrate from a position obliquely below the substrate held at the substrate treatment position by the substrate holding unit.

With this arrangement, the first nozzle spouts the treatment liquid at a predetermined angle downward toward the substrate from the position immediately above the substrate in the treatment vessel, and the second nozzle spouts the treatment liquid at a predetermined angle downward toward the substrate from the position obliquely above the substrate in the treatment vessel. Further, the third nozzle spouts the treatment liquid at a predetermined angle toward the substrate from the position located laterally of the substrate to a side wall of the treatment vessel opposed to the nozzle, and the fourth nozzle spouts the treatment liquid at a predetermined angle upward toward the substrate from the position below the substrate in the treatment vessel. Thus, the treatment liquid is spouted toward the substrate from different positions around the substrate, whereby the temperature of the substrate loaded into the treatment vessel is efficiently raised. This ensures uniform substrate treatment.

Further, the first nozzle and the second nozzle promote the downward flow of the treatment liquid on a surface of the substrate. Thus, the treatment liquid used for the treatment of the substrate rapidly flows down into the treatment liquid retained in a lower portion of the treatment vessel. Therefore, particles contained in the treatment liquid used for the substrate treatment is substantially prevented from adhering again to the substrate.

The substrate treatment apparatus preferably further includes a cover which openably covers an upper portion of the chamber or an upper portion of the treatment vessel.

With this arrangement, the provision of the cover which openably covers the upper portion of the chamber makes it possible to freely transport the substrate into and out of the chamber and the treatment vessel. It is also possible to suppress the temperature reduction of components provided in the chamber and the treatment vessel, the temperature reduction of the treatment liquid retained in the treatment vessel, and the temperature reduction of the internal atmospheres of the chamber and the treatment vessel. In addition, the internal atmosphere of the treatment vessel can be isolated from the external atmosphere of the chamber and, therefore, can be kept clean. This improves the cleanliness of the substrate, while ensuring uniform substrate treatment.

Further, the provision of the cover which openably covers the upper portion of the treatment vessel makes it possible to freely transport the substrate into and out of the treatment vessel. It is also possible to suppress the temperature reduction of components provided in the treatment vessel, the temperature reduction of the treatment liquid retained in the treatment vessel, and the temperature reduction of the internal atmosphere of the treatment vessel. In addition, the internal atmosphere of the treatment vessel can be isolated from the external atmosphere of the treatment vessel and, therefore, can be kept clean. This improves the cleanliness of the substrate, while ensuring uniform substrate treatment.

Openable covers may be respectively provided on the upper portion of the chamber and the upper portion of the treatment vessel. In this case, a sealed atmosphere is defined in the chamber between the external atmosphere of the chamber and the sealed internal atmosphere of the treatment vessel. This more efficiently suppresses the temperature reduction of the components provided in the treatment vessel, the temperature reduction of the internal atmosphere of the treatment vessel and the temperature reduction of the treatment liquid retained in the treatment vessel.

The first nozzle may be provided in the cover.

With this arrangement, the first nozzle is provided in the cover which covers the upper portion of the chamber or the upper portion of the treatment vessel, so that a space required for providing the nozzle can be reduced. When the cover is opened for loading the substrate into the treatment vessel or unloading the substrate from the treatment vessel, the first nozzle is moved together with the cover and, therefore, does not hinder the loading/unloading of the substrate. Thus, the substrate can be uniformly treated by spouting the treatment liquid from the position immediately above the substrate. This arrangement is also contributory to the size reduction of the substrate treatment apparatus.

According to another embodiment of the present invention, the substrate treatment apparatus further includes a second circulation unit including a second spouting portion which is located below the first spouting portion (preferably below the first liquid surface level) and spouts the treatment liquid in the treatment vessel, a filter which cleans the treatment liquid retained in the treatment vessel, and a temperature controller which controls the temperature of the treatment liquid retained in the treatment vessel, the second circulation unit being adapted to circulate the treatment liquid from the treatment vessel through a second circulation path extending through the filter and the temperature controller of the second circulation unit back into the treatment vessel.

With this arrangement, the treatment liquid is circulated through the first circulation path and the second circulation path each extending through the temperature controller, so that the temperature of the treatment liquid retained in the treatment vessel can be controlled at the constant level by efficient circulation of the treatment liquid. This ensures more uniform treatment of the substrate. The second circulation unit is adapted to spout the treatment liquid from the second spouting portion located below the first spouting portion (preferably below the first liquid surface level) into the treatment vessel, making it possible to circulate the treatment liquid while substantially preventing the mist of the treatment liquid from soaring.

The control unit may be adapted to cause the second circulation unit to circulate the treatment liquid from the treatment vessel and then switch a circulation path from the second circulation unit to the first circulation unit to spout the treatment liquid from the first spouting portion into the treatment vessel before the substrate is loaded into the treatment vessel.

With this arrangement, the temperature of the treatment liquid in the treatment vessel can be continuously controlled by switching the circulation path from the second circulation unit to the first circulation unit. By switching the circulation path before the loading of the substrate into the treatment vessel, a lower-temperature treatment liquid stagnated in the piping of the first circulation unit is preliminarily replaced with the treatment liquid controlled at the predetermined temperature by the time immediately before the loading of the substrate. Thus, the substrate can be uniformly treated. Further, the treatment liquid is spouted from the first spouting portion and the treatment vessel is filled with the mist of the treatment liquid spouted from the first spouting portion by the time immediately before the loading of the substrate. Therefore, particles adhering to the components provided in the treatment vessel and particles floating in the internal atmosphere of the treatment vessel are rinsed away to flow into the treatment liquid retained in the lower portion of the treatment vessel. Thus, the treatment vessel is cleaned, thereby ensuring highly clean substrate treatment.

The control unit may be adapted to cause the second circulation unit to circulate the treatment liquid from the treatment vessel and then cause the first circulation unit and the second circulation unit to circulate the treatment liquid from the treatment vessel to spout the treatment liquid from the first spouting portion and the second spouting portion into the treatment vessel before the substrate is loaded into the treatment vessel.

With this arrangement, the treatment liquid retained in the treatment vessel is circulated from the treatment vessel by the two circulation units, so that the flow amount of the circulated treatment liquid is increased. Therefore, the particles adhering to the components in the treatment vessel and the particles present in the internal atmosphere of the treatment vessel can be quickly removed, so that a clean treatment space suitable for the substrate treatment can be provided in the treatment vessel.

Further, the control unit may be adapted to cause the first circulation unit to stop circulating the treatment liquid, and cause the second circulation unit to circulate the treatment liquid to spout the treatment liquid from the second spouting portion into the treatment vessel during a period for which the cover is open.

With this arrangement, the circulation of the treatment liquid by the first circulation unit is stopped during the cover opening period, so that the spouting of the treatment liquid from the first spouting portion in air is stopped. This substantially prevents the atmosphere containing the mist of the treatment liquid from spreading outside the chamber. On the other hand, the second circulation unit spouts the treatment liquid into the treatment vessel from the second spouting portion located below the first spouting portion (preferably located below the first liquid surface level), making it possible to circulate the treatment liquid while substantially preventing the mist of the treatment liquid from soaring. Thus, the temperature of the treatment liquid can be maintained at the constant level by circulating the treatment liquid while substantially preventing the mist of the treatment liquid from spreading outside the chamber. This ensures uniform substrate treatment.

According to further another embodiment of the present invention, the first circulation path and the second circulation path are designed to have a common path, in which the filter and the temperature controller are disposed to be shared by the first circulation unit and the second circulation unit.

With this arrangement, the filter and the temperature controller are disposed in the common path which is shared by the first and second circulation paths, thereby simplifying the construction of the apparatus for cost reduction.

According to still another embodiment of the present invention, the first circulation path and the second circulation path are independent of each other.

With this arrangement, the first circulation path and the second circulation path are independent of each other and, therefore, are independently operable. Thus, the first circulation path and the second circulation path are allowed to have, for example, different circulation characteristics. More specifically, the first circulation path and the second circulation path may be adapted to circulate the treatment liquid at different flow rates. Further, the overall flow amount of the treatment liquid to be circulated may be increased by operating both the first circulation unit and the second circulation unit. Thus, the temperature of the treatment liquid can be more efficiently and precisely controlled. After a fresh treatment liquid is supplied into the treatment vessel, the treatment liquid is quickly stirred to be homogenized to have a predetermined constituent concentration by operating both the first circulation unit and the second circulation unit.

The filter of the first circulation unit and the filter of the second circulation unit have different filtering characteristics.

With this arrangement, the treatment liquid can be circulated through either of the filters having different filtering characteristics by switching between the first circulation unit and the second circulation unit. For example, the first circulation unit and the second circulation unit may be adapted to circulate the treatment liquid at different flow rates, and filters having different filtering characteristics may be respectively provided in the first circulation path and the second circulation path according to the flow rates. This makes it possible to efficiently trap the particles in the treatment liquid by means of the filters, while preventing the clogging of the filters.

According to further another embodiment of the present invention, the control unit causes the first circulation unit to circulate the treatment liquid from the treatment vessel to spout the treatment liquid from the first spouting portion into the treatment vessel immediately after the substrate is unloaded from the treatment vessel to the outside.

With this arrangement, the first circulation unit circulates the treatment liquid from the treatment vessel to spout the treatment liquid from the first spouting portion into the treatment vessel immediately after the substrate is unloaded from the treatment vessel. This prevents a constituent of the treatment liquid and the particles contained in the treatment liquid from being deposited to adhere to an interior wall of the treatment vessel and the components provided in the treatment vessel due to the reduction in the temperature of the treatment liquid.

Therefore, the treatment vessel can be kept clean to prevent the particles from being transferred between different lots of substrates. This suppresses variations in substrate treatment between the different lots of substrates.

The substrate treatment apparatus may further include a treatment region changing unit which relatively moves a treatment liquid spouting region to which the treatment liquid is spouted from the first spouting portion in air and the substrate held by the substrate holding unit to change a treatment region on the substrate to be treated with the treatment liquid.

With this arrangement, the treatment region on the substrate surface is changed by the relative movement of the treatment liquid spouting region and the substrate. This makes it possible to uniformly treat the substrate surface.

The treatment region changing unit may include a swing unit which changes a treatment liquid spouting direction in which the treatment liquid is spouted from the first spouting portion. Alternatively, the treatment region changing unit may include a swing unit which moves up and down the substrate holding unit in the treatment vessel in a manner such that the substrate does not contact the liquid surface (first liquid surface level) of the treatment liquid retained in the treatment vessel.

The substrate treatment apparatus may further include a buffer tank which stores the treatment liquid outside the treatment vessel. In this case, the control unit may be adapted to: control the treatment liquid supply unit to control the liquid surface level of the treatment liquid retained in the treatment vessel at a second liquid surface level set so as to permit the substrate held at the substrate treatment position to be entirely immersed in the treatment liquid to perform an immersion treatment on the substrate; control the liquid surface level of the treatment liquid retained in the treatment vessel at the first liquid surface level by draining the treatment liquid from the treatment vessel and storing the drained treatment liquid in the buffer tank; and cause the first circulation unit to circulate the treatment liquid from the treatment vessel to spout the treatment liquid from the first spouting portion located above the first liquid surface level toward the substrate held at the substrate treatment position in air.

With this arrangement, the immersion treatment can be performed to treat the substrate by immersing the substrate in the treatment liquid retained to the second liquid surface level in the treatment vessel. After the immersion treatment, the treatment liquid surface level in the treatment vessel is controlled at the first liquid surface level, and the substrate is treated by spouting the treatment liquid from the first spouting portion in air. Thus, the substrate can be treated by the spouting treatment as well as the immersion treatment, and yet the transfer of the particles is suppressed. After the immersion treatment, the treatment liquid retained in the treatment vessel is transferred from the treatment vessel to the buffer tank. This reduces the consumption of the treatment liquid.

The substrate treatment apparatus may further include a liquid feed unit which supplies the treatment liquid from the buffer tank into the first circulation path. In this case, the control unit may be adapted to control the liquid feed unit to supply the treatment liquid from the buffer tank into the treatment vessel through the first spouting portion of the first circulation unit.

With this arrangement, the treatment liquid retained in the buffer tank is supplied from the buffer tank into the first circulation path, and further supplied into the treatment vessel from the first spouting portion. Thus, the treatment liquid stored in the buffer tank can be reused, so that the consumption of the treatment liquid can be reduced.

The substrate treatment apparatus preferably further includes a third circulation unit including a filter which cleans the treatment liquid stored in the buffer tank, and a temperature controller which controls the temperature of the treatment liquid stored in the buffer tank, the third circulation unit being adapted to circulate the treatment liquid from the buffer tank through a third circulation path extending through the filter and the temperature controller of the third circulation unit back into the buffer tank.

With this arrangement, the treatment liquid is circulated from the buffer tank by the third circulation unit to control the temperature of the treatment liquid and remove particles from the treatment liquid. Thus, the treatment liquid stored in the buffer tank can be kept in standby for subsequent use.

According to still another embodiment of the present invention, the first circulation path and the third circulation path are designed to have a common path, in which the filter and the temperature controller are disposed to be shared by the first circulation unit and the third circulation unit.

With this arrangement, the filter and the temperature controller can be shared by the first and third circulation units, thereby simplifying the construction of the apparatus for cost reduction.

According to further another embodiment of the present invention, the first circulation path and the third circulation path are independent of each other.

With this arrangement, the first circulation path and the third circulation path are independently operable. Therefore, the treatment liquid stored in the buffer tank is temperature-controlled and cleaned by operating the third circulation unit, while the treatment liquid is spouted in air in the treatment vessel by operating the first circulation unit. Therefore, the substrate treatment with the treatment liquid can be promptly started by supplying the treatment liquid from the buffer tank into the treatment vessel.

The substrate treatment apparatus may further include an outer vessel which stores a treatment liquid overflowing from the treatment vessel, and a fourth circulation unit which circulates the treatment liquid from the outer vessel into the treatment vessel through a fourth circulation path provided with a filter.

With this arrangement, the immersion treatment can be performed, while the treatment liquid is allowed to overflow from the treatment vessel. Thus, the particles can be efficiently removed from the treatment liquid. Thus, the immersion treatment can be performed more cleanly. Accordingly, the substrate treatment can be more uniformly and cleanly performed by utilizing the immersion treatment in combination with the spouting treatment in which the treatment liquid is spouted from the first spouting portion in air.

According to still another embodiment of the present invention, the first circulation path and the fourth circulation path are designed to have a common path, in which the filter is disposed to be shared by the first circulation unit and the fourth circulation unit.

With this arrangement, the filter can be shared by the first and fourth circulation units, thereby simplifying the construction of the apparatus for cost reduction.

The present invention further provides a substrate treatment method for treating a substrate with a treatment liquid. The substrate treatment method includes: an initial preparation step of controlling the liquid surface level of a treatment liquid retained in a treatment vessel at a first liquid surface level, and then causing a first circulation unit to circulate the treatment liquid from the treatment vessel, the first liquid surface level being set lower than a lower portion of a substrate held at a substrate treatment position for treatment with the treatment liquid in the treatment vessel so as to prevent the treatment liquid retained in the treatment vessel from contacting the substrate held at the substrate treatment position; a substrate treatment step of spouting the treatment liquid circulated by the first circulation unit from a first spouting portion located above the first liquid surface level toward the substrate held at the substrate treatment position in air in the treatment vessel; and the step of cleaning the treatment liquid by a filter disposed in a first circulation path through which the treatment liquid is circulated by the first circulation unit, and controlling the temperature of the treatment liquid by a temperature controller disposed in the first circulation path.

The substrate treatment method preferably further includes the steps of: causing a second circulation unit to circulate the treatment liquid from the treatment vessel back into the treatment vessel through a second circulation path having a second spouting portion provided below the first spouting portion (more preferably below the first liquid surface level) for spouting the treatment liquid in the treatment vessel; and cleaning the treatment liquid by a filter disposed in the second circulation path through which the treatment liquid is circulated by the second circulation unit, and controlling the temperature of the treatment liquid by a temperature controller disposed in the second circulation path.

According to one embodiment of the present invention, the initial preparation step includes the step of causing the first circulation unit or the second circulation unit to circulate the treatment liquid. The substrate treatment method further includes: a standby process step of causing the second circulation unit to circulate the treatment liquid from the treatment vessel after the initial preparation step; and a substrate loading step of loading the substrate into the treatment vessel from the outside after the standby process step before the substrate treatment step. The standby process step includes a pre-loading process step of switching a circulation path from the second circulation unit to the first circulation unit to spout the treatment liquid from the first spouting portion into the treatment vessel before the substrate loading step.

According to another embodiment of the present invention, the initial preparation step includes the step of causing the first circulation unit or the second circulation unit to circulate the treatment liquid. The substrate treatment method further includes a standby process step of causing the second circulation unit to circulate the treatment liquid from the treatment vessel after the initial preparation step; and a substrate loading step of loading the substrate into the treatment vessel from the outside after the standby process step, before the substrate treatment step. The standby process step includes a pre-loading process step of causing the first circulation unit and the second circulation unit to circulate the treatment liquid from the treatment vessel to spout the treatment liquid from the first spouting portion and the second spouting portion into the treatment vessel before the substrate loading step.

According to further another embodiment of the present invention, the substrate treatment method further includes a substrate unloading step of unloading the substrate from the treatment vessel to the outside after the substrate treatment step; and a post-unloading process step of causing the first circulation unit to circulate the treatment liquid from the treatment vessel to spout the treatment liquid from the first spouting portion into the treatment vessel immediately after the substrate unloading step.

The substrate treatment step preferably includes a treatment region changing step of relatively moving a treatment liquid spouting region to which the treatment liquid is spouted from the first spouting portion in air and a substrate held by a substrate holding unit which holds and moves the substrate in the treatment vessel so as to change a treatment region on the substrate to be treated with the treatment liquid.

The foregoing and other objects, features and effects of the present invention will become more apparent from the following detailed description of the preferred embodiments with reference to the attached drawings.

DETAILED DESCRIPTION OF THE PREFERRED EMBODIMENTS

<First Embodiment>

Figure 1:
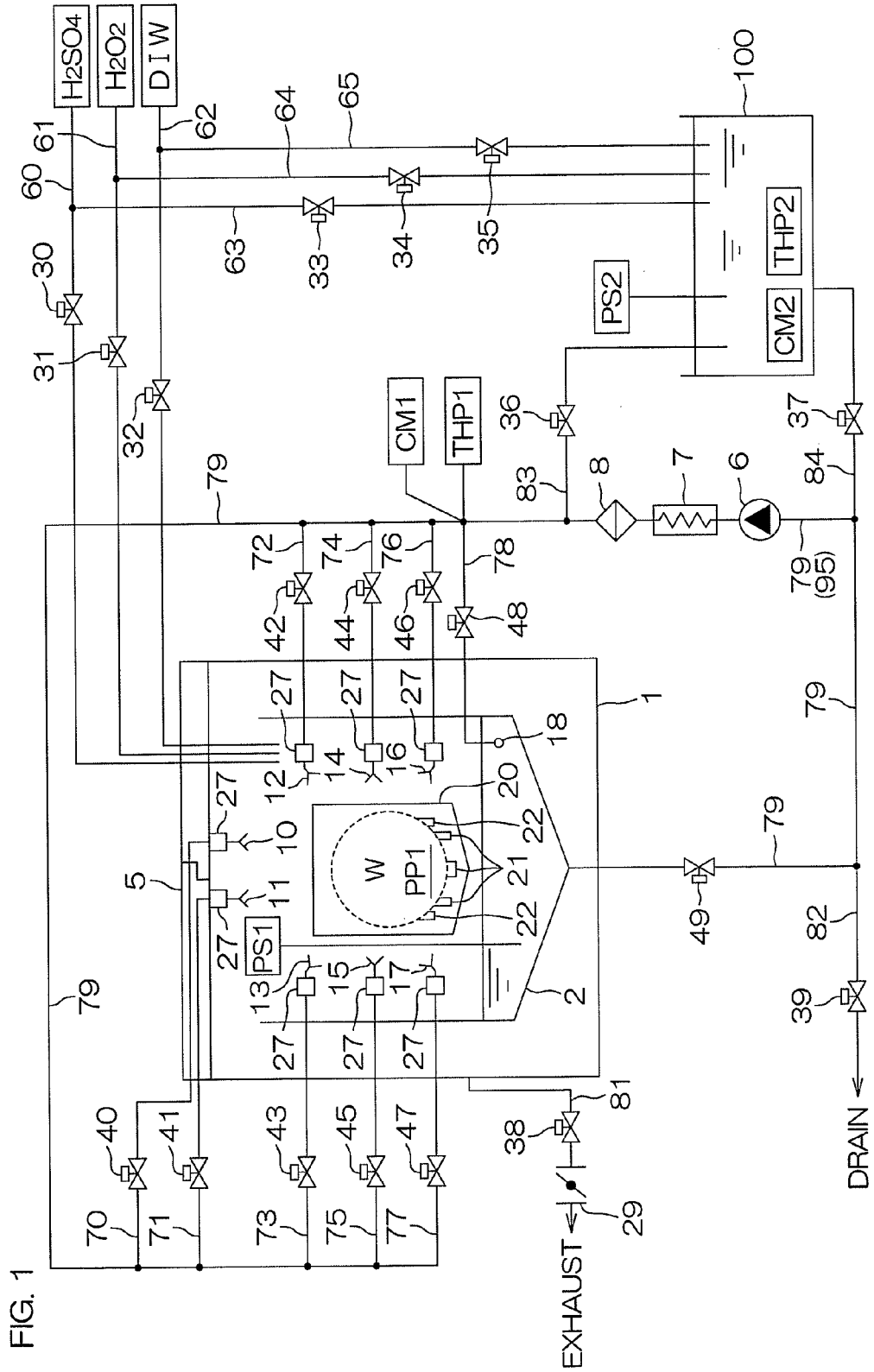
FIG. 1 is a diagram schematically showing the overall construction of a substrate treatment apparatus according to a first embodiment of the present invention.

FIG. 1 is a diagram schematically showing the construction of a substrate treatment apparatus according to one embodiment (first embodiment) of the present invention. The substrate treatment apparatus is adapted to simultaneously clean a plurality of substrates, for example, by using a treatment liquid such as an SPM solution.

Figure 2:
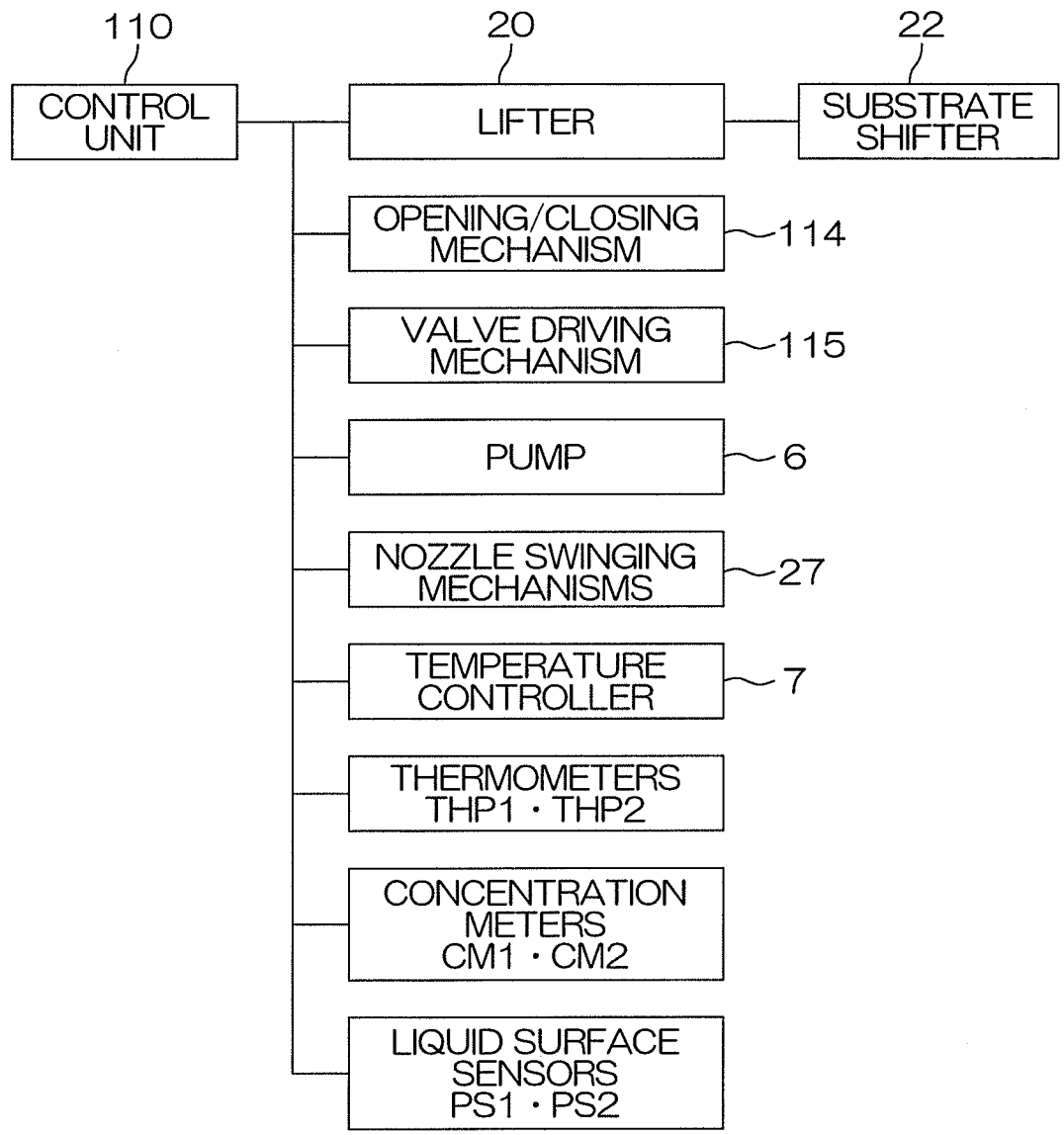
FIG. 2 is a diagram showing the configuration of a control unit of the substrate treatment apparatus according to the first embodiment of the present invention.

The substrate treatment apparatus includes a chamber 1, a treatment vessel 2 provided in the chamber 1, a lifter 20 (substrate holding unit), a buffer tank 100, and a control unit 110 (see FIG. 2). The treatment vessel 2 is capable of retaining a small amount of treatment liquid, and defines a treatment space therein for treating the plurality of substrates W. The lifter 20 is adapted to simultaneously transport the plurality of substrates W into and out of the treatment vessel 2. The control unit 110 controls the operation of the overall substrate treatment apparatus. The substrates W are, for example, substrates which each have a resist film formed on a surface thereof as having a surface layer cured by modification by ion implantation. The substrate treatment apparatus is adapted to perform a resist peel-off process to remove the resist from the surfaces of the substrates W with the use of the SPM solution.

The chamber 1 includes a cover 5 which openably covers an upper opening of the chamber 1. The cover 5 is adapted to cover and uncover the opening above the treatment vessel 2. The chamber 1 is connected to an exhaust pipe 81 (exhaust unit).

The treatment vessel 2 is provided in the chamber 1 so as to be enclosed by the chamber 1. Therefore, the treatment vessel 2 and an internal atmosphere of the treatment vessel 2 are less liable to be influenced by an external atmosphere of the chamber 1. This makes it possible to maintain the treatment vessel 2 and the internal atmosphere of the treatment vessel 2 at a constant temperature while suppressing intrusion of foreign matter from the outside of the chamber 1. Therefore, the plurality of substrates can be treated uniformly and cleanly.

The cover 5 is opened and closed when the substrates W are transported into or out of the chamber by the lifter 20. With the cover 5 closed, the internal atmosphere and the external atmosphere of the chamber 1 are isolated from each other. Therefore, the internal atmosphere of the chamber 1 is a sealed space. Thus, the internal atmosphere of the treatment vessel 2 is sealed in the chamber 1.

The substrate treatment apparatus includes outlet pipes 70, 71 through which the treatment liquid is supplied to the substrates W. The outlet pipes 70, 71 extend through the cover 5.

Nozzle opening/closing valves 40, 41 are respectively provided in the outlet pipes 70, 71. By opening and closing the nozzle opening/closing valves 40, 41, treatment liquid flow paths through which the treatment liquid is supplied from the outlet pipes 70, 71 to the substrates W in the treatment vessel 2 can be opened and closed.

First nozzles 10, 11 are respectively provided at downstream ends of the outlet pipes 70, 71. The first nozzles 10, 11 are disposed on the interior of the cover 5 (inside the chamber 1), and are adapted to spout the treatment liquid toward the inside of the treatment vessel 2.

The exhaust pipe 81 (exhaust unit) has an upstream end connected to the chamber 1, and a downstream end connected to an exhaust line of a plant facility. A treatment vessel exhaust valve 38 and an exhaust control mechanism 29 are provided in this order downstream of the chamber 1 with respect to an exhaust flow direction in the exhaust pipe 81. The treatment vessel exhaust valve 38 is adapted to open and close an exhaust flow path defined in the exhaust pipe 81 to permit and prohibit the exhaust of gas. The exhaust control mechanism 29 is adapted to control an exhaust flow rate at which the gas flows through the exhaust path. The states (pressures, gas flows and the like) of the internal atmospheres of the chamber 1 and the treatment vessel 2 can be properly controlled by controlling the exhaust flow rate by the exhaust control mechanism 29. This prevents the internal atmospheres of the treatment vessel 2 and the chamber 1 from flowing out of the chamber 1. In addition, the internal atmosphere temperature of the treatment vessel 2 and the concentrations of constituents of the treatment liquid contained in the internal atmosphere of the treatment vessel 2 can be properly controlled. This makes it possible to treat the substrates W with the constituent concentrations at a stable temperature.

The substrate treatment apparatus further includes treatment vessel liquid supply pipes 60, 61, 62, a treatment vessel circulation pipe 79, outlet pipes 72 to 77, a treatment vessel bypass pipe 78 and a liquid surface sensor PS1. The liquid surface sensor PS1 is adapted to detect the liquid surface level of the treatment liquid retained in the treatment vessel 2.

The treatment vessel liquid supply pipes 60, 61, 62 define a treatment liquid supply unit which supplies the treatment liquid to the treatment vessel 2. The treatment vessel liquid supply pipes 60, 61, 62 extend into the chamber 1 through the wall of the chamber 1. In the chamber 1, the treatment vessel liquid supply pipes 60, 61, 62 extend into the treatment vessel 2, and each have a downstream end in the treatment vessel 2. Treatment vessel liquid supply valves 30, 31, 32 are respectively provided in the treatment vessel liquid supply pipes 60, 61, 62.

The treatment vessel liquid supply pipes 60, 61, 62 each have an upstream end connected to a chemical liquid supply system provided in the plant facility (not shown). In this embodiment, the chemical liquid supply system supplies sulfuric acid ($H_2SO_4$), a hydrogen peroxide aqueous solution ($H_2O_2$) and deionized water (DIW) to the upstream ends of the treatment liquid supply pipes 60, 61 and 62, respectively.

The supply of these constituent liquids to the treatment vessel 2 is controlled by opening and closing the treatment vessel liquid supply valves 30, 31, 32 respectively provided in the treatment vessel liquid supply pipes 60, 61, 62. The supply amounts of the respective constituent liquids are detected by flow rate meters (not shown) respectively provided in the treatment vessel liquid supply pipes 60, 61, 62 and the liquid surface sensor PS1. With this arrangement, predetermined amounts of the respective constituent liquids are supplied into the treatment vessel 2. A treatment liquid (liquid mixture) preliminarily prepared by mixing the constituent liquids at a predetermined mixture ratio may be supplied into the treatment vessel 2.

The treatment vessel circulation pipe 79 has an upstream end connected to the treatment vessel 2. A treatment vessel drain valve 49, a pump 6, a temperature controller 7 and a filter 8 are provided in this order downstream from the upstream end of the treatment vessel circulation pipe 79 (a liquid drain port of the treatment vessel 2).

A portion of the treatment vessel circulation pipe 79 downstream of the filter 8 is branched to be connected to the outlet pipes 70 to 77 and the treatment vessel bypass pipe 78.

The treatment vessel circulation pipe 79 connected to the treatment vessel 2 and the outlet pipes 70 to 77 define a first circulation path of a first circulation unit. A part of the treatment vessel circulation pipe 79 connected to the treatment vessel 2 and the treatment vessel bypass pipe 78 define a second circulation path of a second circulation unit. The first circulation path and the second circulation path have a common path 95 defined by the part of the treatment vessel circulation pipe 79. The pump 6, the temperature controller 7 and the filter 8 are provided in the common path 95, and shared by the first and second circulation units.

The treatment vessel drain valve 49 is opened when the treatment liquid is drained out of the treatment vessel 2, and closed when the treatment liquid is retained in the treatment vessel 2.

The pump 6 serves as a liquid feed unit which circulates the treatment liquid from the treatment vessel 2 through the first circulation unit and the second circulation unit back into the treatment vessel 2.

The temperature controller 7 is adapted to control the temperature of the treatment liquid fed into the treatment vessel 2 by the pump 6 at a predetermined temperature level. A heating device (heater) having a heating function for heating the treatment liquid, a cooling device having a cooling function for cooling the treatment liquid or a temperature controller having both the heating function and the cooling function may be selected as the temperature controller 7 depending on the conditions of the treatment liquid.

The filter 8 is used for removing impurities such as particles contained in the treatment liquid fed to be circulated by the pump 6, whereby impurities are removed from the treatment liquid retained in the treatment vessel 2.

Nozzle opening/closing valves 42 to 47 are respectively provided in the outlet pipes 72 to 77. Flow paths of the treatment liquid to be spouted from the outlet pipes 72 to 77 are opened and closed by opening and closing the nozzle opening/closing valves 42 to 47.

Second nozzles 12, 13 are respectively provided at downstream ends of the outlet pipes 72, 73. Third nozzles 14, 15 are respectively provided at downstream ends of the outlet pipes 74, 75. Fourth nozzles 16, 17 are respectively provided at downstream ends of the outlet pipes 76, 77. The nozzles 12 to 17 are disposed in the treatment vessel 2. Of these nozzles 12 to 17, the second nozzles 12, 13 are located at the uppermost level, and the fourth nozzles 16, 17 are located at the lowermost level. The third nozzles 14, 15 are located between the second nozzles 12, 13 and the fourth nozzles 16, 17.

The nozzles 10 to 17 define a first spouting portion which spouts the treatment liquid toward the substrates W held by the lifter 20.

The treatment liquid is divergently spouted or showered from the nozzles 10 to 17 (first spouting portion). The showering profile (divergent spouting profile) depends on the design of the nozzles 10 to 17. Therefore, nozzles each having a conical or linear spouting profile are selected depending on conditions for the substrate treatment.

The nozzles 10 to 17 are located in the following positional relationship with respect to the substrates W held by the lifter 20 (substrate holding unit) in the treatment vessel 2, more specifically, with respect to the substrates W located at a position (substrate treatment position PP1) at which the substrates W are treated with the treatment liquid.

The first nozzles 10, 11 are located immediately above the substrates W and directed downward. The second nozzles 12, 13 are located obliquely above the substrates W and directed obliquely downward. The third nozzles 14, 15 are located laterally of the substrates W and directed laterally inward (generally horizontally). The fourth nozzles 16, 17 are located obliquely below the substrates W and directed obliquely upward. The nozzles 10 to 17 are directed toward the substrates W held at the substrate treatment position PP1. The nozzles 10 to 17 are directed perpendicularly to a substrate aligning direction in which the substrates W held at the substrate treatment position PP1 are aligned (perpendicularly to the paper face of FIG. 1). The nozzles 10 to 17 each include a plurality of nozzle heads spaced a predetermined distance from each other in the substrate aligning direction, and are each adapted to spout the treatment liquid toward the substrates W from the plurality of nozzle heads.

The first nozzles 10 and 11 are located symmetrically with respect to a symmetry plane defined by a vertical plane extending through the centers of the substrates W perpendicularly to the surfaces of the substrates W held at the substrate treatment position PP1 in the treatment vessel 2. The second nozzles 12 and 13 are also symmetrical with respect to the symmetry plane. The third nozzles 14 and 15 are also symmetrical with respect to the symmetry plane. The fourth nozzles 16 and 17 are also symmetrical with respect to the symmetry plane.

The nozzles 10 to 17 (first spouting portion) are located so that treatment liquid spouting ranges in which the treatment liquid spouted from the respective nozzle heads is spread can overlap each other around the centers of the surfaces of the substrates. Further, the nozzles 10 to 17 are located so that peripheral portions of the substrates W on which residues are liable to remain can be completely covered with the spouting ranges of the respective nozzle heads for reliable cleaning.

Thus, the treatment liquid can be spouted toward the substrates W perpendicularly to the substrate aligning direction from the nozzle heads spaced the predetermined distance from each other in the substrate aligning direction. By thus spouting the treatment liquid, the cured resist layers which are formed on the substrate surfaces by the modification by the ion implantation and are not easily removed from the substrate surfaces are cracked, and the treatment liquid is allowed to infiltrate into the resist from the resulting cracks. Thus, the resist can be quickly and efficiently removed from the substrate surfaces.

The first nozzles 10, 11, the second nozzles 12, 13, the third nozzles 14, 15 and the fourth nozzles 16, 17 each desirably include a nozzle swinging mechanism 27.

The nozzle swinging mechanism 27 may include a nozzle movement mechanism which moves the nozzle vertically and laterally in the treatment vessel 2. The nozzle swinging mechanism 27 may further include a spouting angle changing mechanism which changes the spouting angle of the nozzle. The provision of the properly designed nozzle swinging mechanisms 27 makes it possible to more uniformly treat the substrate surfaces. The nozzle swinging mechanisms 27 are an example of a treatment region changing unit which relatively moves the substrates W and the treatment liquid spouting regions to which the treatment liquid is spouted from the nozzles 10 to 17 (first spouting portion) to change treatment regions on the substrates to be treated with the treatment liquid.

A treatment vessel bypass valve 48 is provided in the treatment vessel bypass pipe 78. The treatment vessel bypass valve 48 is adapted to open and close a treatment liquid flow path defined in the treatment vessel bypass pipe 78. A second spouting portion 18 is provided at a downstream end of the treatment vessel bypass pipe 78 in the treatment vessel 2.

The second spouting portion 18 is disposed below the fourth nozzles 16, 17 provided in the treatment vessel 2. The position and the spouting direction of the second spouting portion 18 are preferably determined so that the treatment liquid spouted from the second spouting portion 18 is not directly applied to the substrates W in the treatment vessel 2 and the treatment liquid retained in the treatment vessel 2 is not splashed to the substrates W. More specifically, the second spouting portion 18 may be directed toward the bottom of the treatment vessel 2 and a lower portion of an interior wall of the treatment vessel 2 in the treatment vessel 2.

A thermometer THP1 and a concentration meter CM1 are provided in the portion of the treatment vessel circulation pipe 79 downstream of the filter 8. The temperature of the treatment liquid retained in the treatment vessel 2 is detected by the thermometer THP1, and controlled by the temperature controller 7. The constituent concentrations of the treatment liquid retained in the treatment vessel 2 are detected by the concentration meter CM1, and controlled by selectively supplying the constituent liquids from the treatment vessel liquid supply pipes 60, 61, 62.

The lifter 20 includes a substrate holder 21 which holds the substrates W, and a substrate shifter 22 which changes holding positions on the substrates W during the treatment.

The substrate shifter 22 is movable relative to the lifter 20 vertically of the treatment vessel 2, and moved up and down by a vertical mechanism not shown. When the substrate shifter 22 is moved upward of the treatment vessel 2 by the vertical mechanism, the substrates W are moved away from the substrate holder 21 fixed to the lifter 20, and held only by the substrate shifter 22.

The substrate shifter 22 holds the substrates W in contact with the peripheral portions of the substrates W. The substrate shifter 22 contact the peripheral portions of the substrates W at a plurality of contact positions defined symmetrically with respect to the vertical plane extending through the centers of the substrates W held at the substrate treatment position PP1. These contact positions are located more apart from the vertical plane extending through the centers of the substrates W than contact positions at which the peripheral portions of the substrates W contact the substrate holder 21.

The buffer tank 100 is provided outside the chamber 1, and used for recovering the treatment liquid used for the treatment in the treatment vessel 2. The treatment liquid recovered in the buffer tank 100 is controlled as having the predetermined constituent concentrations at the predetermined temperature, and then fed again into the treatment vessel 2 for use as the treatment liquid.

In the first embodiment, the buffer tank 100 is provided in the substrate treatment apparatus. However, the buffer tank may be disposed outside the substrate treatment apparatus depending on the conditions for the substrate treatment and the installation space in the apparatus.

Buffer tank liquid supply pipes 63, 64, 65, a buffer tank drain pipe 84 and a buffer tank liquid feed pipe 83 are connected to the buffer tank 100. A liquid surface sensor PS2 which detects the liquid surface level of the treatment liquid retained in the buffer tank 100, a thermometer THP2 which detects the temperature of the treatment liquid retained in the buffer tank 100 and a concentration meter CM2 which detects the constituent concentrations of the treatment liquid retained in the buffer tank 100 are provided in association with the buffer tank 100.

Buffer tank liquid supply valves 33, 34, 35 are respectively provided in the buffer tank liquid supply pipes 63, 64, 65. Portions of the buffer tank liquid supply pipes 63, 64, 65 upstream of the buffer tank liquid supply valves 33, 34, 35 are connected to portions of the treatment vessel liquid supply pipes 60, 61, 62 upstream of the treatment vessel liquid supply valves 30, 31, 32, respectively. Therefore, the treatment liquid can be supplied to the buffer tank 100 by opening and closing the buffer tank liquid supply valves 33, 34, 35.

A buffer tank drain valve 37 is provided in the buffer tank drain pipe 84. The buffer tank drain pipe 84 has an upstream end connected to the buffer tank 100, and a downstream end connected to a part of the treatment vessel circulation pipe 79 between a downstream side of the treatment vessel drain valve 49 and an upstream side of the pump 6.

A buffer tank bypass valve 36 is provided in the buffer tank liquid feed pipe 83. The buffer tank liquid feed pipe 83 has a downstream end connected to the buffer tank 100, and an upstream end connected to a part of the treatment vessel circulation pipe 79 between a downstream side of the filter 8 and the thermometer THP1/the concentration meter CM1.

By driving the pump 6 with the treatment vessel drain valve 49 and the buffer tank bypass valve 36 open, the treatment liquid retained in the treatment vessel 2 is fed from the treatment vessel 2 into the buffer tank 100 through the treatment vessel circulation pipe 79 and the buffer tank liquid feed pipe 83. The treatment liquid retained in the buffer tank 100 is drained from the buffer tank 100 into the buffer tank drain pipe 84, and then pumped into the treatment vessel circulation pipe 79 by the pump 6, whereby the temperature of the treatment liquid is controlled by the temperature controller 7 and impurities are removed from the treatment liquid by the filter 8. Then, the treatment liquid is fed back into the buffer tank 100 through the buffer tank liquid feed pipe 83. Thus, the treatment liquid controlled at the predetermined temperature is stored in the buffer tank 100. That is, a third circulation unit is provided, which circulates the treatment liquid through a third circulation path defined by the buffer tank drain pipe 84, the common path 95 (a part of the treatment vessel circulation pipe 79) and the buffer tank liquid feed pipe 83. The pump 6, the temperature controller 7 and the filter 8 provided in the common path 95 are shared by the first, second and third circulation units.

The buffer tank liquid supply valves 33 to 35 are opened and closed according to the constituent concentrations detected by the concentration meter CM2. Thus, the treatment liquid stored in the buffer tank 100 is controlled as having the predetermined constituent concentrations.

By driving the pump 6 with the buffer tank drain valve 37 open and with the nozzle opening/closing valves 40 to 47 or the treatment vessel bypass valve 48 open, the treatment liquid retained in the buffer tank 100 can be fed from the buffer tank 100 into the treatment vessel 2 through the buffer tank drain pipe 84 and the treatment vessel circulation pipe 79 (common path 95) or the treatment vessel bypass pipe 78. That is, the pump 6, the buffer tank drain pipe 84 and the like define a liquid feed unit which feeds the treatment liquid from the buffer tank 100 into the treatment vessel 2.

When the treatment vessel 2 is to be cleaned, the treatment liquid may be displaced from the treatment vessel 2 into the buffer tank 100. Therefore, the consumption of the chemical liquids can be reduced without the need for discarding the treatment liquid retained in the treatment vessel 2.

A treatment liquid drain pipe 82 is connected to the downstream side of the treatment vessel drain valve 49. A treatment liquid drain valve 39 is provided in the treatment liquid drain pipe 82. The treatment liquid drain pipe 82 has an upstream end connected to the portion of the treatment vessel circulation pipe 79 between the downstream side of the treatment vessel drain valve 49 and the upstream side of the pump 6, and a downstream end connected to a drain line provided in the plant facility. The treatment liquid drain valve 39 is normally closed, and opened when the treatment liquid is drained from the treatment vessel 2 and the buffer tank 100 to the plant facility.

Next, the control unit 100 will be described with reference to FIG. 2.

The control unit 110 controls the lifter 20 and the substrate shifter 22 provided in the lifter 20, an opening/closing mechanism 114 for the cover 5, a valve driving mechanism 115 for opening and closing the respective valves, the pump 6, the nozzle swinging mechanisms 27 for swinging the respective nozzles 10 to 17, and the temperature controller 7.

Further, the control unit 110 monitors the temperatures of the treatment liquid detected by the thermometers THP1, THP2, the constituent concentrations of the treatment liquid detected by the concentration meters CM1, CM2, and the liquid surface levels of the treatment liquid detected by the liquid surface sensors PS1, PS2.

Referring next to FIGS. 3, 4, 5, 6, 7 and 8, an exemplary substrate treatment method to be performed by the aforementioned substrate treatment apparatus according to the first embodiment will be described.

Figure 3:
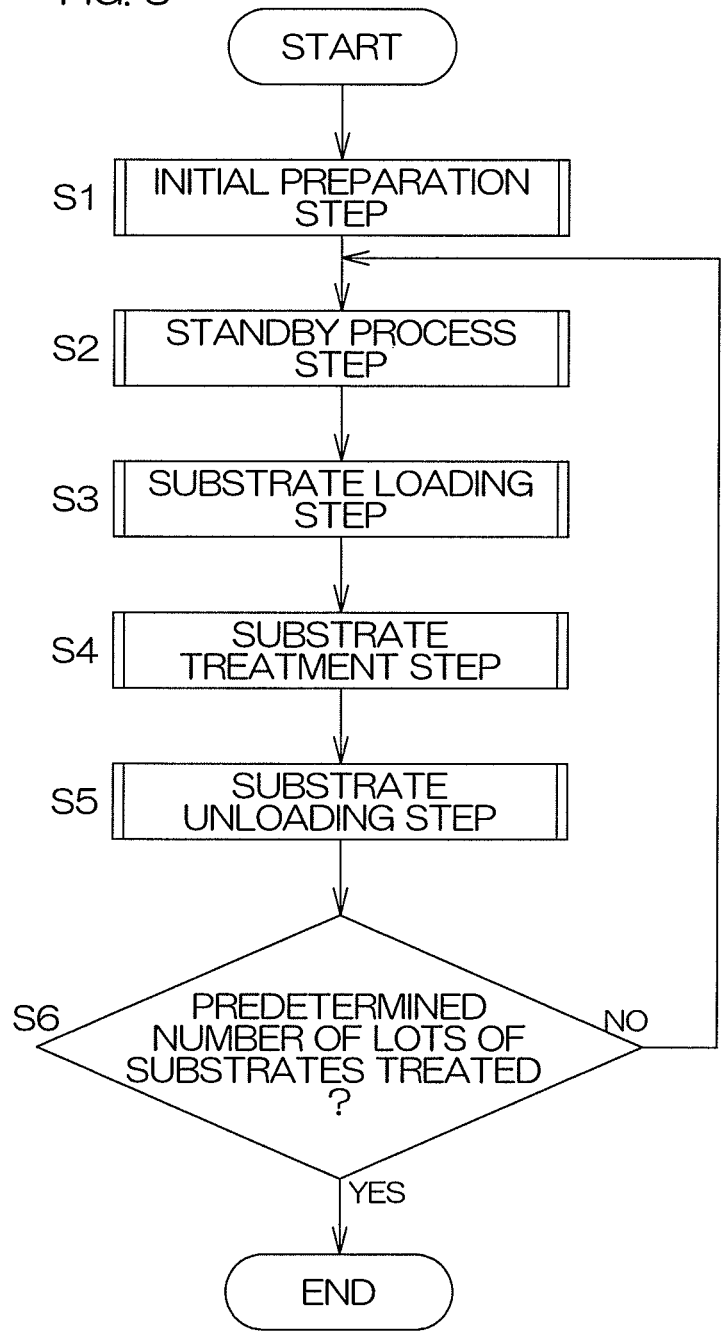
FIG. 3 is a flow chart showing an overall process sequence according to the first embodiment of the present invention.
Figure 4:
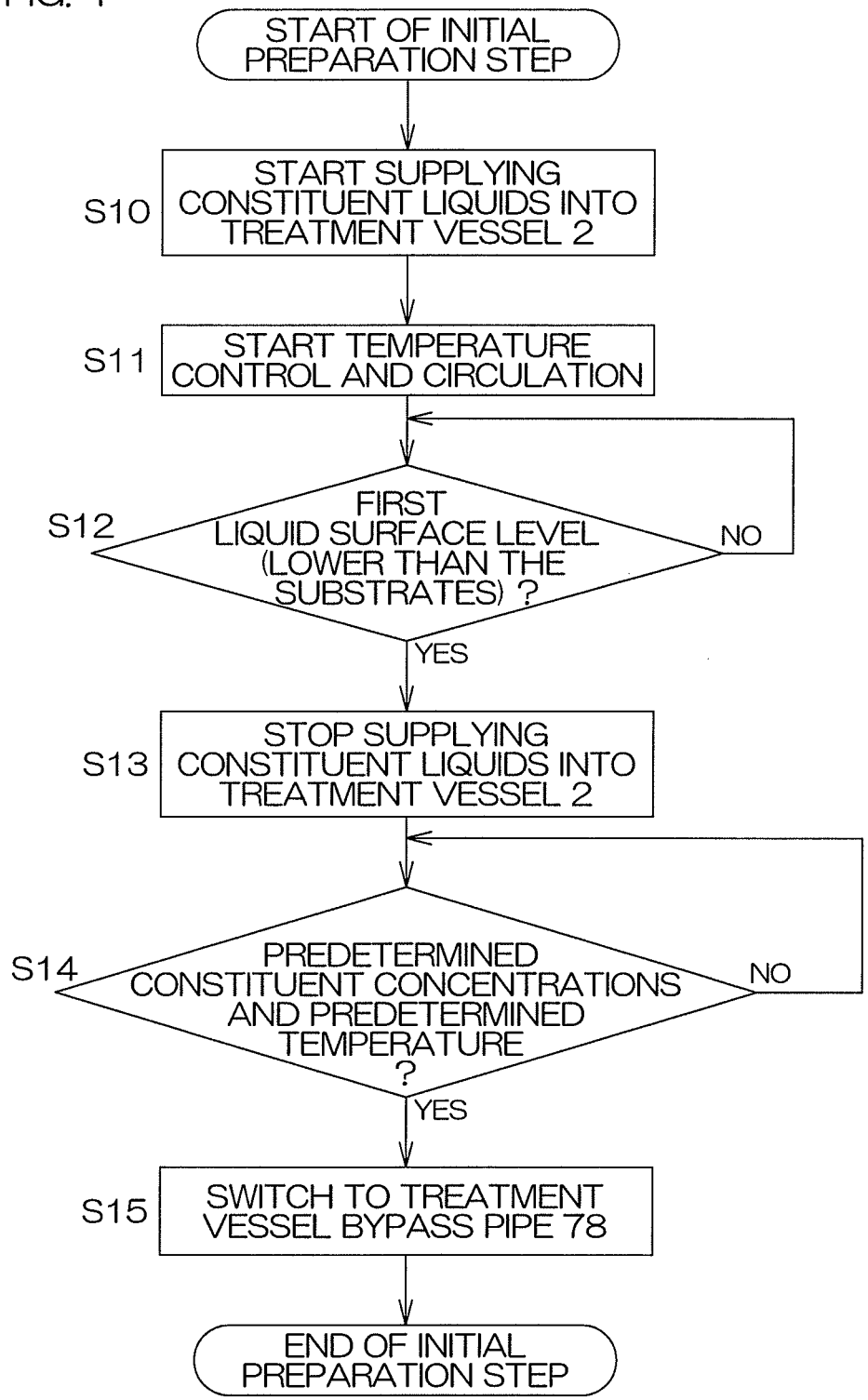
FIG. 4 is a flow chart showing an initial preparation step according to the first embodiment of the present invention.
Figure 5:
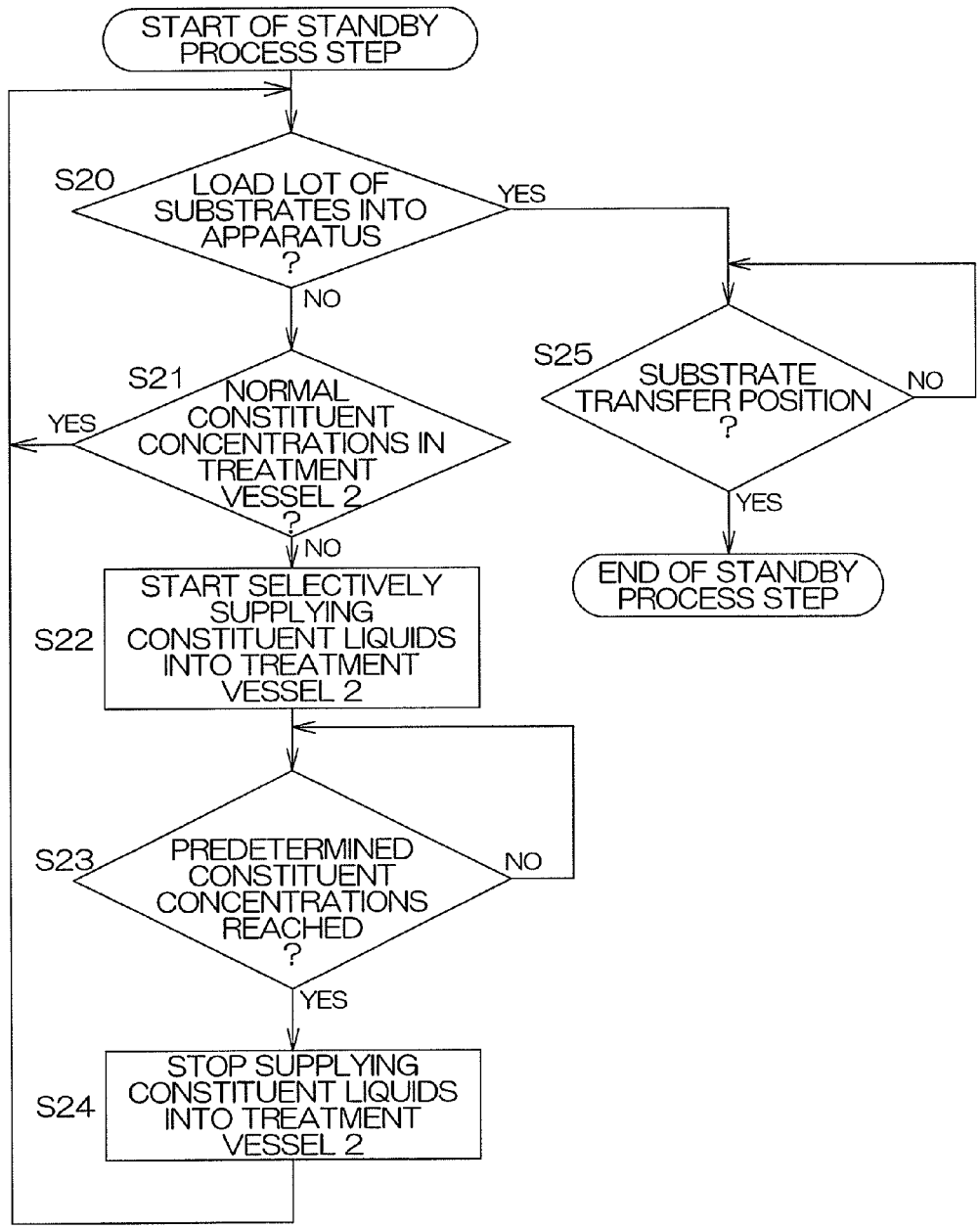
FIG. 5 is a flow chart showing a standby process step according to the first embodiment of the present invention.
Figure 6:
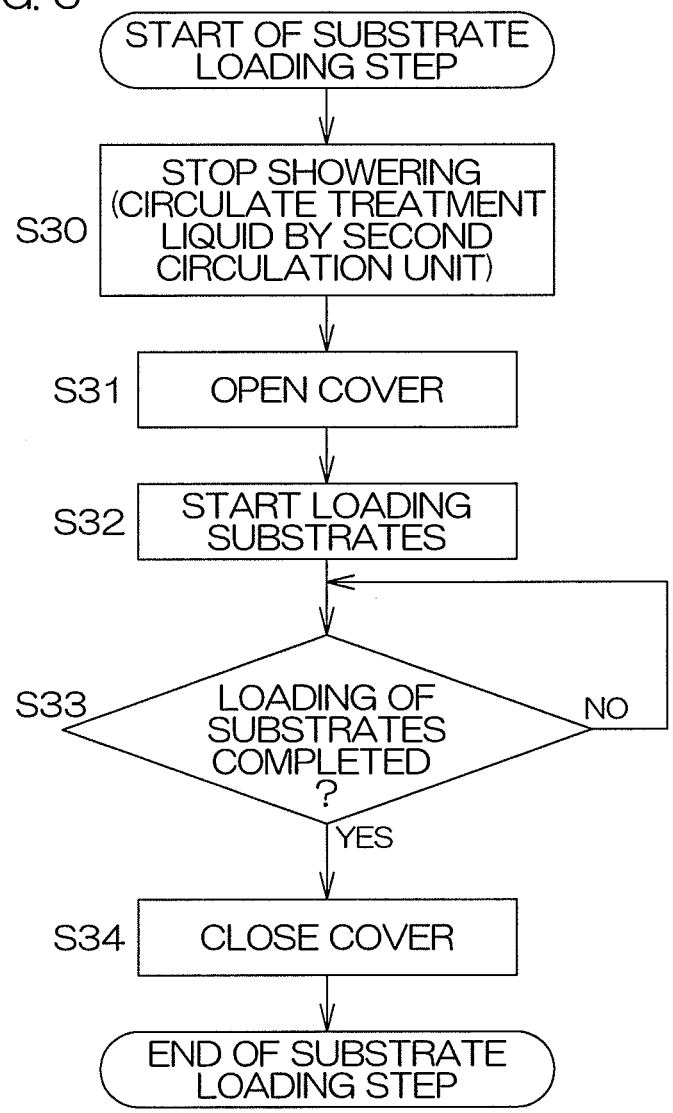
FIG. 6 is a flow chart showing a substrate loading step according to the first embodiment of the present invention.
Figure 7:
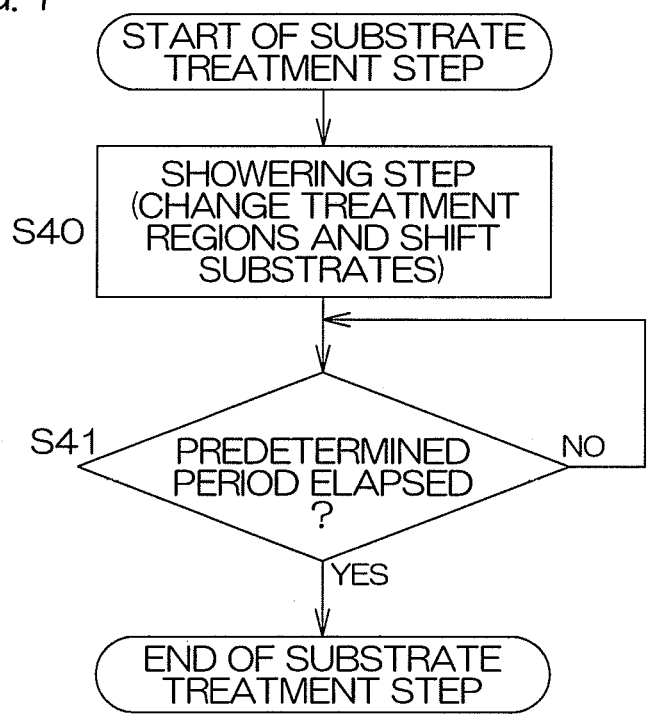
FIG. 7 is a flow chart showing a substrate treatment step according to the first embodiment of the present invention.
Figure 8:
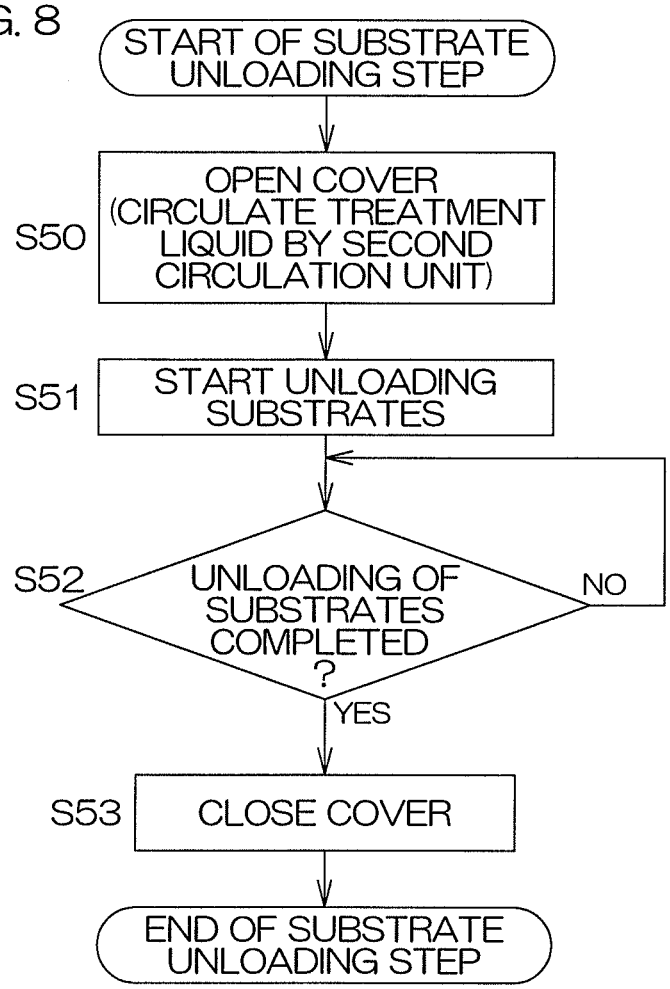
FIG. 8 is a flow chart showing a substrate unloading step according to the first embodiment of the present invention.

FIG. 3 is a flow chart showing an overall process sequence according to the first embodiment. FIG. 4 is a flow chart showing an initial preparation step according to the first embodiment. FIG. 5 is a flow chart showing a standby process step according to the first embodiment. FIG. 6 is a flow chart showing a substrate loading step according to the first embodiment. FIG. 7 is a flow chart showing a substrate treatment step according to the first embodiment. FIG. 8 is a flow chart showing a substrate unloading step according to the first embodiment.

Referring to FIG. 3, the overall process sequence of the substrate treatment method according to the first embodiment will be described.

First, the initial preparation step (Step S1) is performed. In the initial preparation step, the treatment liquid is prepared for the treatment of substrates W by supplying the treatment liquid into the treatment vessel 2.

Then, the standby process step (Step S2) is performed. In the standby process step, the internal atmosphere of the treatment vessel 2 and the treatment liquid retained in the treatment vessel 2 are maintained in predetermined states before the substrates W are loaded into the substrate treatment apparatus.

Subsequently, the substrate loading step (Step S3) is performed. In the substrate loading step, substrates W held by a substrate transport robot not shown are transferred to the lifter 20 at a substrate transfer position located above the treatment vessel 2. Further, the lifter 20 transports the transferred substrates W to the substrate treatment position PP1.

After the substrate loading step, the substrate treatment step (Step S4) is performed. In the substrate treatment step, the substrates W are treated in the treatment vessel 2 for a predetermined period of time according to a predetermined recipe.

After the substrate treatment step, the substrate unloading step (Step S5) is performed.

In the substrate unloading step, the lifter transports the substrates W from the substrate treatment position PP1 in the treatment vessel 2 to the substrate transfer position located above the treatment vessel 2. Further, the substrates are transferred from the lifter 20 to the transport robot.

Then, the control unit 100 determines whether a predetermined number of lots of substrates have been treated (Step S6). If the predetermined number of lots of substrates have been treated, the process sequence ends. If the treatment of the predetermined number of lots of substrates is not completed, the control unit 100 performs the standby process step (Step S2).

Referring next to FIGS. 4, 5, 6, 7 and 8, the process sequence from the initial preparation step (Step S1) to the substrate unloading step (Step S5) will be described in detail.

Referring first to FIG. 4, the initial preparation step (Step S1 in FIG. 3) will be described in detail.

By opening the treatment vessel liquid supply valves 30, 31, 32, the constituent liquids are supplied into the treatment vessel 2 from the plant facility, and are mixed together in the treatment vessel 2 to prepare the treatment liquid (Step S10). The supply amounts of the respective constituent liquids are measured by flow meters (not shown) provided in the treatment vessel liquid supply pipes 60, 61, 62, and monitored by the control unit 110 which receives output signals from the flow meters. The control unit 110 controls the supply amounts of the respective constituent liquids so that the constituent liquids are mixed at a predetermined mixing ratio in the treatment vessel 2 and the liquid surface of the resulting treatment liquid is maintained at the predetermined constant level in the treatment vessel 2.

As described above, the treatment liquid preliminarily prepared by mixing the constituent liquids at the predetermined mixing ratio may be supplied to the predetermined constant level in the treatment vessel 2.

The liquid surface level of the treatment liquid retained in the treatment vessel 2 is detected by the liquid surface sensor PS1, and monitored by the control unit 110 which receives an output signal from the liquid surface sensor PS1. The control unit 110 is kept in standby until the liquid surface level of the treatment liquid in the treatment vessel 2 reaches a height level (lower than the predetermined constant level) at which the pump 6 and the temperature controller can be actuated. After the liquid surface level reaches this height level, the control unit 110 actuates the pump 6 and the temperature controller 7, and opens the treatment vessel drain valve 49 and the nozzle opening/closing valves 40 to 47. Thus, the treatment liquid is drained from the treatment vessel 2 into the treatment vessel circulation pipe 79, and pumped into the outlet pipes 70 to 77 by the pump 6. The pumped treatment liquid is spouted into the treatment vessel 2 from the first nozzles 10, 11, the second nozzles 12, 13, the third nozzles 14, 15 and the fourth nozzles 16, 17. Thus, the treatment liquid is circulated and mixed with the treatment liquid present in the treatment vessel 2 (Step S11). During the circulation and the mixing, the temperature controller 7 provided in the treatment vessel circulation pipe 79 is controlled so that the temperature detected by the thermometer THP1 is kept at the predetermined temperature level. Thus, the temperature of the treatment liquid is controlled (e.g., increased) and, at the same time, the temperatures of the nozzles 10 to 17, the outlet pipes 70 to 77 respectively extending to the nozzles 10 to 17 and other piping system are controlled (Step S11). At this time, the supply of the constituent liquids started in Step S10 is continued.

After Step S11, the control unit 110 determines whether the liquid surface of the treatment liquid retained in the treatment vessel 2 reaches the predetermined constant level, and further determines based on the output signal of the concentration meter CM1 whether the treatment liquid is controlled to have the predetermined constituent concentrations (Step S12). The constant level is defined as a first liquid surface level which is lower than the lower edges of the substrates W held at the substrate treatment position PP1 and lower than the spouts of the fourth nozzles 16, 17. Further, the constant level is set far below the lower edges of the substrates W held at the substrate treatment position PP1 so as to prevent the substrates W from being affected by the treatment liquid atmosphere.

When the liquid surface of the treatment liquid retained in the treatment vessel 2 reaches the predetermined constant level and the treatment liquid has the predetermined constituent concentrations (YES in Step S12), the control unit 110 stops the supply of the constituent liquids to the treatment vessel 2 which is started in Step S10 (Step S13).

Further, the control unit 110 determines based on the output signal of the thermometer THP1 whether the treatment liquid retained in the treatment vessel 2 is controlled at the predetermined temperature (Step S14). In Step S14, the control unit 110 also continuously monitors the output signal of the concentration meter CM1 to confirm that the treatment liquid has the predetermined constituent concentrations. After confirming that the treatment liquid retained in the treatment vessel 2 reaches the predetermined temperature during the circulation of the treatment liquid through the treatment vessel circulation pipe 79, the control unit 110 closes the nozzle opening/closing valves 40 to 47 and opens the treatment vessel bypass valve 48. Thus, the circulation path is switched to the treatment vessel bypass pipe 78 (Step S15). If the first nozzles 10, 11, the second nozzles 12, 13, the third nozzles 14, and the fourth nozzles 16, 17 (first spouting portion) were used for the liquid circulation during a period immediately before the loading of the substrates W, the chamber 1 would be filled with the mist of the treatment liquid. This would cause the mist of the treatment liquid to spread outside the apparatus when the cover 5 is opened for the loading of the substrates W. By switching the circulation path to the treatment vessel bypass pipe 78, the mist of the treatment liquid is substantially prevented from spreading outside the apparatus. The second spouting portion 18 of the treatment vessel bypass pipe 78 is configured so as to prevent the generation of the mist, for example, to spout the treatment liquid in the form of a so-called continuous flow. In this manner, the initial preparation step (Step S1) is completed. Subsequently to Step S1, the standby process step (Step S2) is performed.

Referring next to FIG. 5, the standby process step (Step S2 in FIG. 3) will be described in detail.

First, the control unit 110 determines whether the substrates (lot) to be treated by the substrate treatment apparatus are loaded into the substrate treatment apparatus (Step S20).

If no lot is loaded in the substrate treatment apparatus for a long period of time (NO in Step S20), the constituent concentrations of the treatment liquid retained in the treatment vessel 2 are liable to change. Therefore, the control unit 110 acquires the constituent concentrations of the treatment liquid detected by the concentration meter CM1, and determines whether the constituent concentrations of the treatment liquid retained in the treatment vessel 2 each fall within a normal range (Step S21).

If the constituent concentrations of the treatment liquid in the treatment vessel 2 each fall within the normal range, the routine performed by the control unit 110 returns to Step S20.

If the constituent concentrations of the treatment liquid in the treatment vessel 2 are abnormal (NO in Step S21), the control unit 110 selectively supplies the constituent liquids into the treatment vessel 2 until the constituent concentrations of the treatment liquid in the treatment vessel 2 reach the predetermined constituent concentrations (Steps S22, S23). More specifically, the control unit 110 controls the constituent concentrations of the treatment liquid by selectively opening the treatment vessel liquid supply valves 30 to 32 for deficient constituent liquids.

When the constituent concentrations of the treatment liquid detected by the concentration meter CM1 reach the predetermined concentration levels, the control unit 110 stops supplying the constituent liquids into the treatment vessel 2 (Step S24), and performs Step S20.

A command for the loading of the lot of substrates is inputted from an upstream apparatus located upstream of the substrate treatment apparatus. The upstream apparatus herein means an apparatus which performs a process preceding the substrate treatment process to be performed by the substrate treatment apparatus in a production line which performs a substrate treatment process sequence including the substrate treatment process. When the command for the loading of the lot is applied to the substrate treatment apparatus (YES in Step S20), the control unit 110 checks whether the substrate transport robot (not shown) located outside the chamber 1 reaches the substrate transfer position at which the substrates W are transferred to the lifter 20 (Step S25). If it is confirmed that the substrate transport robot reaches the substrate transfer position (YES in Step S25), the control unit 110 (Step S2), and subsequently performs the substrate loading step (Step S3).

Next, the substrate loading step (Step S3 in FIG. 3), the substrate treatment step (Step S4 in FIG. 3) and the substrate unloading step (Step S5 in FIG. 3) will be described with reference to FIGS. 6, 7 and 8, respectively.

In the substrate loading step (Step S3), the control unit 110 opens the treatment vessel bypass valve 48 provided in the treatment vessel bypass pipe 78, and then closes the nozzle opening/closing valves 40 to 47 respectively provided in the outlet pipes 70 to 77. Thus, the showering of the treatment liquid from the first nozzles 10, 11, the second nozzles 12, 13, the third nozzles 14, 15 and the fourth nozzles 16, 17 is stopped (Step S30), and the treatment liquid circulation path is switched to the treatment vessel bypass pipe 78. If the circulation path is already switched to the treatment vessel bypass pipe 78, the control unit 110 maintains this state.

Since the treatment liquid is not spouted from the nozzles 10 to 17, the chemical liquid atmosphere is prevented from leaking outside the chamber 1 during the loading of the substrates. Further, the treatment liquid can be circulated through the second spouting portion 18 provided in the treatment vessel bypass pipe 78. This prevents the temperature reduction of the treatment liquid retained in the treatment vessel 2 and the temperature reduction of the treatment liquid present in the filter 8, and makes it possible to efficiently trap the particles present in the treatment liquid by the filter 8 even during the loading of the substrates. The second spouting portion 18 preferably has a spouting position located below the liquid surface of the treatment liquid retained to the constant level in the treatment vessel 2. Thus, the circulated treatment liquid is spouted in the treatment liquid retained in the treatment vessel 2, so that the chemical liquid atmosphere can be reliably prevented from leaking outside the chamber 1.

After Step S30, the control unit 110 controls the cover opening/closing mechanism 114 (see FIG. 2) to open the cover 5 of the chamber 1 (Step S31).

Thereafter, the control unit 110 controls the lifter 20 so that the substrates W transferred from the substrate transport robot to the lifter 20 is loaded to the substrate treatment position PP1 in the treatment vessel 2 (Step S32). That is, the lifter 20 receives the substrates W at the predetermined substrate transfer position located above the treatment vessel 2 from the substrate transport robot provided outside the chamber 1, and then transports the substrates W to the substrate treatment position PP1 in the treatment vessel 2.

After confirming that the substrates W reach the predetermined substrate treatment position PP1 (YES in Step S33), the control unit 110 controls the cover opening/closing mechanism 114 to close the cover 5 (Step S34). Thus, the substrate loading step (Step S3) is completed.

The substrate treatment position PP1 is defined as a position such that treatment liquid directions) in which the treatment liquid is spouted from the nozzle heads of the third nozzles 14, 15 extend through the centers of the substrate surfaces of the substrates W held by the lifter 20 in the treatment vessel 2. Further, the substrate treatment position PP1 is defined so that the lower edges of the substrates W to be treated are located above the liquid surface of the treatment liquid retained in the treatment vessel 2. The treatment liquid spouting center directions are herein defined as directions in which the treatment liquid flows along center axes of the spouting profiles of the treatment liquid divergently spouted from the nozzle heads of the third nozzles 14, 15.

After the substrate loading step (Step S3), the substrate treatment step (Step S4) is performed.

In the substrate treatment step (Step S4), the control unit 110 opens the nozzle opening/closing valves 40 to 47, and closes the treatment vessel bypass valve 48. Thus, a treatment liquid showering step (Step S40) is performed to shower the treatment liquid from the first nozzles 10, 11, the second nozzles 12, 13, the third nozzles 14, 15 and the fourth nozzles 16, 17 toward the substrates W in the treatment vessel 2. Since the liquid surface level of the treatment liquid is below the substrates W, the treatment liquid showered from the nozzles 10 to 17 reaches the surfaces of the substrates W in air.

The showered treatment liquid used for the substrate treatment flows down together with particles present in an atmosphere around the substrates into the treatment liquid retained in the lower portion of the treatment vessel 2. This prevents the dirty treatment liquid used for the treatment from remaining on the peripheral portions of the substrates W, and prevents the once removed particles from adhering again onto the substrates W.

In the showering step, the treatment liquid can be efficiently circulated from the treatment vessel 2 by spouting the treatment liquid from all of the first nozzles 10, 11, the second nozzles 12, 13, the third nozzles 14, 15 and the fourth nozzles 16, 17 toward the substrates W in air in the treatment vessel 2. In addition, the temperature reduction of the internal atmosphere of the treatment vessel 2 can be prevented.

Further, the surface temperatures of the substrates are stabilized after a lapse of a certain period of time from the start of the showering. Therefore, it is desirable to spout the treatment liquid only from the first nozzles 10, 11 provided in the cover 5 or only from the second nozzles 12, 13 after the lapse of the certain period of time from the start of the showering. Thus, the treatment liquid is spouted downward toward the substrates W held at the substrate treatment position PP1, so that the treatment liquid stably flows on the surfaces of the substrates W. In addition, the treatment liquid used for the treatment flows down in the treatment vessel 2, thereby improving the particle removing effect and the cleaning uniformity.

In the showering step (Step S40), a nozzle swinging operation is preferably performed by causing the nozzle swinging mechanisms 27 to vertically and laterally move the first nozzles 10, 11, the second nozzles 12, 13, the third nozzles 14, 15 and the fourth nozzles 16, 17 in the treatment vessel 2 or change the spouting angles of the nozzles 10 to 17. The nozzle swinging operation makes it possible to change the treatment regions on the substrates to more uniformly treat the substrate surfaces.

Alternatively, the lifter 20 may be vertically moved up and down between the substrate treatment position PP1 and a position upper than the substrate treatment position PP1 during the showering without the provision of the nozzle swinging mechanisms 27. The vertical movement of the lifter 20 during the showering provides the same effect as the nozzle swinging operation. That is, the positional relation between the substrates and the treatment liquid spouting regions to which the treatment liquid is spouted from the nozzles 10 to 17 is changed to change the treatment regions on the substrate surfaces. This makes it possible to uniformly treat the substrate surfaces.

It is desirable to actuate the substrate shifter 22 to change the holding portions of the substrates W during the treatment of the substrates W in the showering step (Step S40).

The substrate shifter 22 is moved up with the substrates W held by the substrate holder 21, whereby the substrate holder 21 is moved away from the substrates W which are in turn held only by the substrate shifter 22. Thus, the holding positions (contact positions) on the substrates W can be changed, so that portions of the substrates W once covered with the substrate holder 21 and hence left untreated can be properly treated. In addition, the transfer of the particles between different lots of substrates can be reliably prevented.

After the showering step is performed according to the predetermined treatment recipe for a predetermined treatment period (YES in Step S41), the control unit 110 opens the bypass valve 48, and closes the nozzle opening/closing valves 40 to 47 provided in the outlet pipes 70 to 77. Thus, the showering of the treatment liquid from the first nozzles 10, 11, the second nozzles 12, 13, the third nozzles 14, 15 and the fourth nozzles 16, 17 is stopped, and the substrate treatment step (Step S4) ends.

In this state, no treatment liquid is spouted from the first nozzles 10, 11, the second nozzles 12, 13, the third nozzles 14, 15 and the fourth nozzles 16, 17, so that the chemical liquid atmosphere is prevented from leaking out during the unloading of the substrates.

After Step S41, the substrate unloading step (Step S5) is performed. The control unit 110 controls the cover opening/closing mechanism 114 to open the cover 5 (Step S50), and controls the lifter 20 to unload the substrates W from the treatment vessel 2 (Step S51). After confirming the completion of the unloading of the substrates W (YES in Step S52), the control unit 110 controls the cover opening/closing mechanism 114 to close the cover 5 (Step S53). Thus, the substrate unloading step (Step S5) ends.

During the substrate unloading step, the treatment liquid is circulated through the second spouting portion 18 provided at the treatment vessel bypass pipe 78. This prevents the temperature reduction of the treatment liquid retained in the treatment vessel 2 and the temperature reduction of the treatment liquid present in the filter 8. In addition, the particles contained in the treatment liquid used for the treatment can be efficiently trapped by the filter 8 even during the unloading of the substrates. Thus, the cleanliness of the treatment liquid contained in the treatment vessel 2 can be constantly maintained in a certain range of cleanliness.

Then, the control unit 110 determines whether the predetermined number of lots of substrates have been treated (Step S6 in FIG. 3). If the predetermined number of lots of substrates have been treated (YES in Step S6), the control unit 110 ends the routine. If the predetermined number of lots of substrates have not been treated (NO in Step S6), the control unit 110 performs the standby process step (Step S2) in standby for the loading of the next lot of substrates to the substrate treatment apparatus.

<Second Embodiment>

Figure 9:
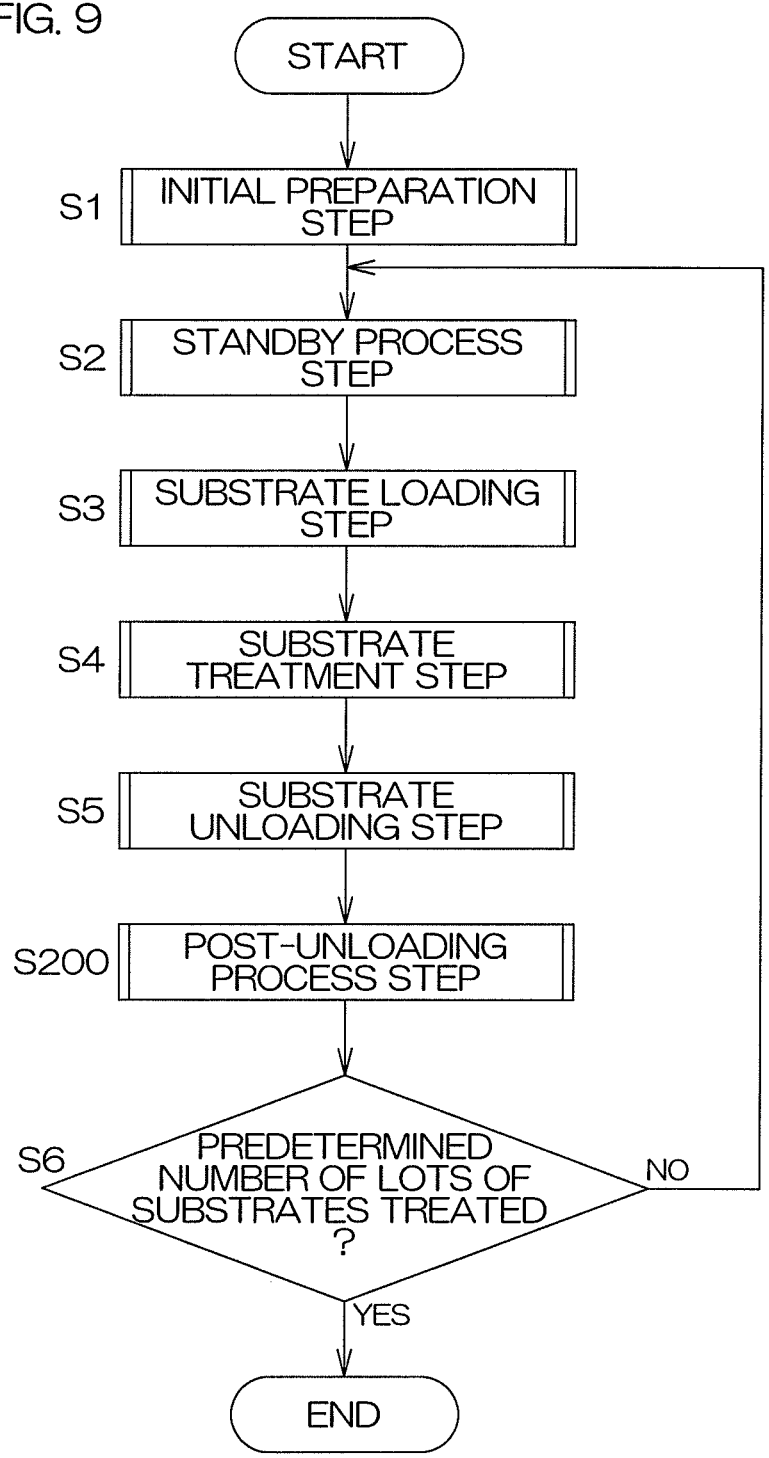
FIG. 9 is a flow chart showing an overall process sequence according to a second embodiment of the present invention.
Figure 10:
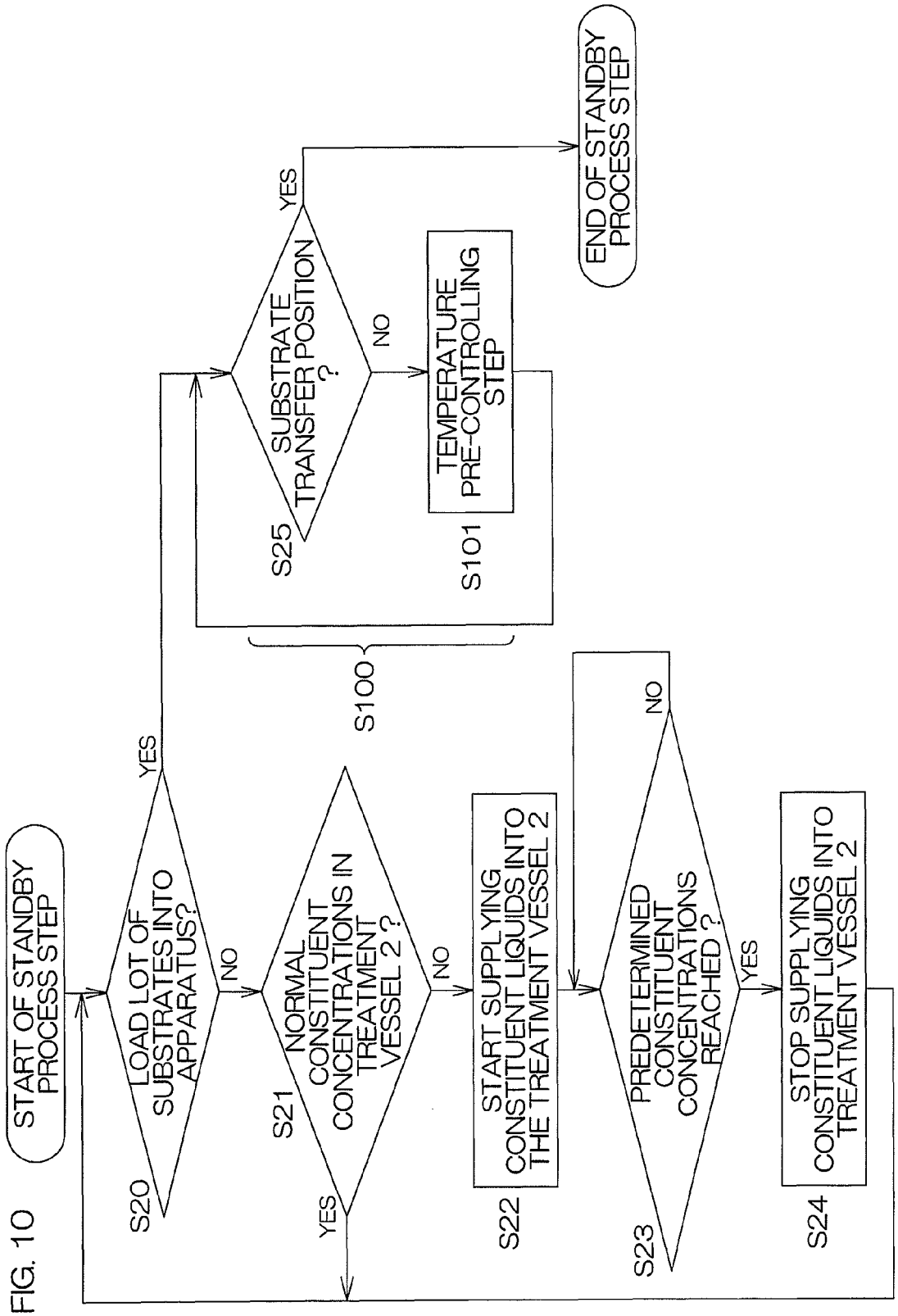
FIG. 10 is a flowchart showing a pre-loading process step according to the second embodiment of the present invention.

Next, a second embodiment of the present invention will be described. A substrate treatment apparatus of this embodiment has the same construction as that of the first embodiment, but a substrate treatment method to be performed by the substrate treatment apparatus is slightly different from that of the first embodiment. In comparison with FIG. 3 which shows the overall process sequence of the substrate treatment method of the first embodiment, the substrate treatment method of the second embodiment differs in the following manner as shown in FIGS. 9 and 10. In the standby process step (Step S2), a pre-loading process step (Step S100) is performed in a period after the command for the loading of a substrate lot is inputted (Step S20) before the substrate loading step (Step S3). Further, a post-unloading process step (Step S200) is performed in a period after the substrate unloading step (Step S5) before Step S6.

Referring next to FIGS. 1 and 10, the pre-loading process step (Step S100) will be described.

In the pre-loading process step (Step S100), the control unit 110 checks, upon reception of the command for the loading of the substrate lot (YES in Step S20), whether the substrate transport robot (not shown) provided outside the chamber 1 reaches the substrate transfer position for transferring the substrates W to the lifter 20 (Step S25). When the substrate transport robot reaches the substrate transfer position (YES in Step S25), the control unit 110 commands the lifter 20 to receive the substrates W, and ends the standby process step (Step S2). Then, the control unit 110 performs the substrate loading step (Step S3).

On the other hand, the control unit 110 performs a temperature pre-controlling step (Step S101) before the substrate transport robot reaches the substrate transfer position for transferring the substrates to the lifer 20 or before the liter 20 is commanded to receive the substrates. More specifically, the control unit 110 opens the treatment vessel drain valve 49 provided in the treatment vessel circulation pipe 79 and the nozzle opening/closing valves 40 to 47 provided in the outlet pipes 70 to 77, and drives the pump 6. Thus, the temperature-controlled treatment liquid is showered from the nozzles 10 to 17 (first spouting portion).

The treatment liquid is thus showered in the treatment vessel 2 immediately before the substrates W are loaded into the treatment vessel 2, whereby the reduction in the temperature of the treatment liquid present in the treatment vessel 2 and the piping is prevented. This ensures more uniform substrate treatment. In addition, the particles present in the internal atmosphere of the treatment vessel 2 can be captured by the showered treatment liquid, and the treatment liquid containing the particles flows down into the treatment liquid retained in the lower portion of the treatment vessel 2. Thus, the internal atmosphere of the treatment vessel 2 can be kept clean, so that the substrates W can be treated in the clean atmosphere. This ensures highly clean substrate treatment.

In the temperature pre-controlling step (Step S101), it is desirable that the control unit 110 opens the treatment vessel bypass valve 48 provided in the treatment vessel bypass pipe 78 to spout the treatment liquid also from the second spouting portion 18. This suppresses the temperature reduction of the treatment liquid present in the treatment vessel bypass pipe 78 without stagnation of the treatment liquid in the treatment vessel bypass pipe 78. This further suppresses the temperature reduction of the treatment liquid retained in the treatment vessel 2.

In the temperature pre-controlling step (Step S101), the control unit 110 may open the exhaust valve 38 provided in the exhaust pipe 81 to exhaust the internal atmosphere of the chamber 1 and the internal atmosphere of the treatment vessel 2 through the exhaust pipe 81 for a predetermined period of time while spouting the treatment liquid from the nozzles 10 to 17 (first spouting portion). Thus, the internal atmosphere of the treatment vessel 2 can be cleaned immediately before the substrates are loaded into the treatment vessel 2, so that the substrates can be more cleanly treated.

In the temperature pre-controlling step (Step S101), the nozzle swinging operation is preferably performed by causing the nozzle swinging mechanisms 27 to swing the nozzles 10 to 17 (first spouting portion). By thus swinging the nozzles 10 to (first spouting portion), the treatment liquid is extensively spread in the treatment vessel 2. This makes it possible to further clean the treatment vessel 2, and reliably prevents the reduction in the internal temperature of the treatment vessel 2.

If the substrate transport robot reaches the substrate transfer position for transferring the substrates to the lifter 20 and the lifter 20 is commanded to receive the substrates, on the other hand, the temperature pre-controlling step (Step S101) ends. Thus, the pre-loading process step (Step S100) ends, and the substrate loading step (Step S3) is subsequently performed.

Figure 11:
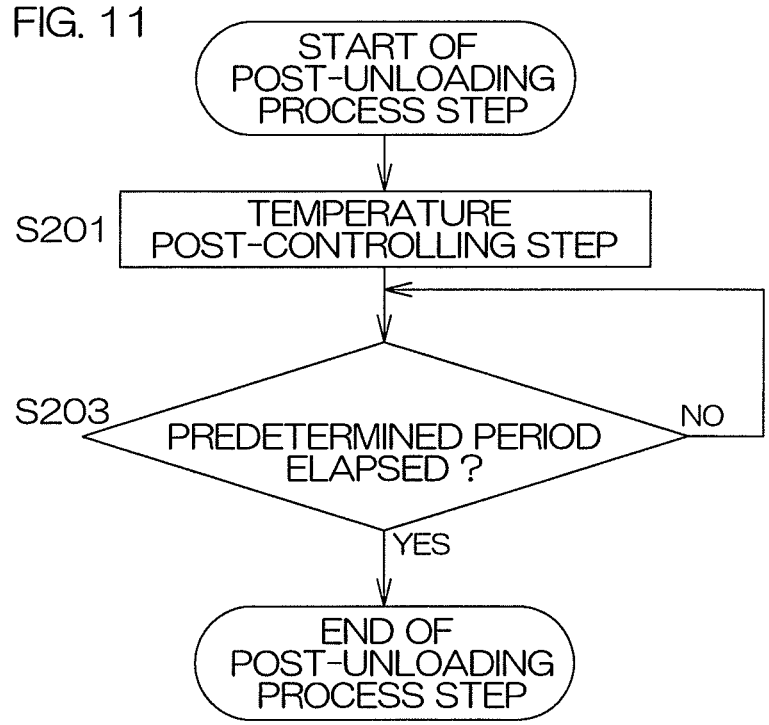
FIG. 11 is a flow chart showing a post-unloading process step according to the second embodiment of the present invention.

Referring next to FIG. 11, the post-unloading process step (Step S200) will be described.

In the post-unloading process step, a temperature post-controlling step (Step A201) is performed. In the temperature post-controlling step (Step S201), the control unit 110 opens the treatment vessel drain valve 49 provided in the treatment vessel circulation pipe 79 and the nozzle opening/closing valves 40 to 47 provided in the outlet pipes 70 to 77, and drives the pump 6. Thus, the treatment liquid is showered into the treatment vessel 2 from the nozzles 10 to 17 (first spouting portion) (Step S201).

The temperature reduction of the treatment liquid retained in the treatment vessel 2 and the piping is suppressed by showering the treatment liquid in the treatment vessel 2 immediately after the substrates are unloaded from the treatment vessel 2. In addition, the treatment vessel 2 possibly contaminated by the substrate treatment can be cleaned immediately after the substrate treatment. Thus, the treatment of the subsequent lot of substrates is hardly affected by the temperature reduction, and the particles are substantially prevents from being transferred to the subsequent lot of substrates. This ensures more uniform treatment of different lots of substrates, and improves the cleanliness of the substrates.

If the inside of the treatment vessel 2 is cooled after the substrate treatment is performed with the use of a liquid mixture of sulfuric acid ($H_2SO_4$) and hydrogen peroxide aqueous solution ($H_2O_2$), the constituents of the treatment liquid are liable to deposit in the treatment vessel 2. The deposition in the treatment vessel 2 after the substrate treatment is substantially prevented by showering the treatment liquid in the treatment vessel 2 immediately after the treated substrates W are unloaded.

In the temperature post-controlling step (Step S201), it is desirable that the control unit 110 opens the treatment vessel bypass valve 48 provided in the treatment vessel bypass pipe 78 to spout the treatment liquid also from the second spouting portion 18. This suppresses the temperature reduction occurring due to the stagnation of the treatment liquid in the treatment vessel bypass pipe 78, thereby further suppressing the temperature reduction of the treatment vessel 2.

In the temperature post-controlling step (Step S201), the control unit 110 preferably performs the nozzle swinging operation by causing the nozzle swinging mechanisms 27 to swing the nozzles 10 to 17 (first spouting portion). By thus swinging the nozzles 10 to 17 (first spouting portion), the treatment liquid is extensively spread in the treatment vessel 2. This further cleans the inside of the treatment vessel 2, and reliably suppresses the reduction in the internal temperature of the treatment vessel 2.

After the temperature post-controlling step (Step S201) is performed for a predetermined period of time (YES in Step S203), the control unit 110 ends the post-unloading process step (Step S200).

<Third Embodiment>

Next, a third embodiment of the present invention will be described. The substrate treatment apparatus of this embodiment has the same construction as those of the first and second embodiments described above, but a substrate treatment method of this embodiment differs from the substrate treatment methods of the first and second embodiments (see FIGS. 3 and 9) in the initial preparation step (Step S1) and the substrate treatment step (Step S4). In the substrate treatment method of this embodiment, a supplied liquid transfer step (Step S300, see FIGS. 14 and 15) is further provided between the substrate unloading step (Step S5) and Step S6. Where this embodiment is applied to the substrate treatment method of the second embodiment (see FIG. 9) as shown in FIG. 15, the supplied liquid transfer step (Step S300) is further provided between the post-unloading process step (Step S200) and Step S6.

Figure 12:
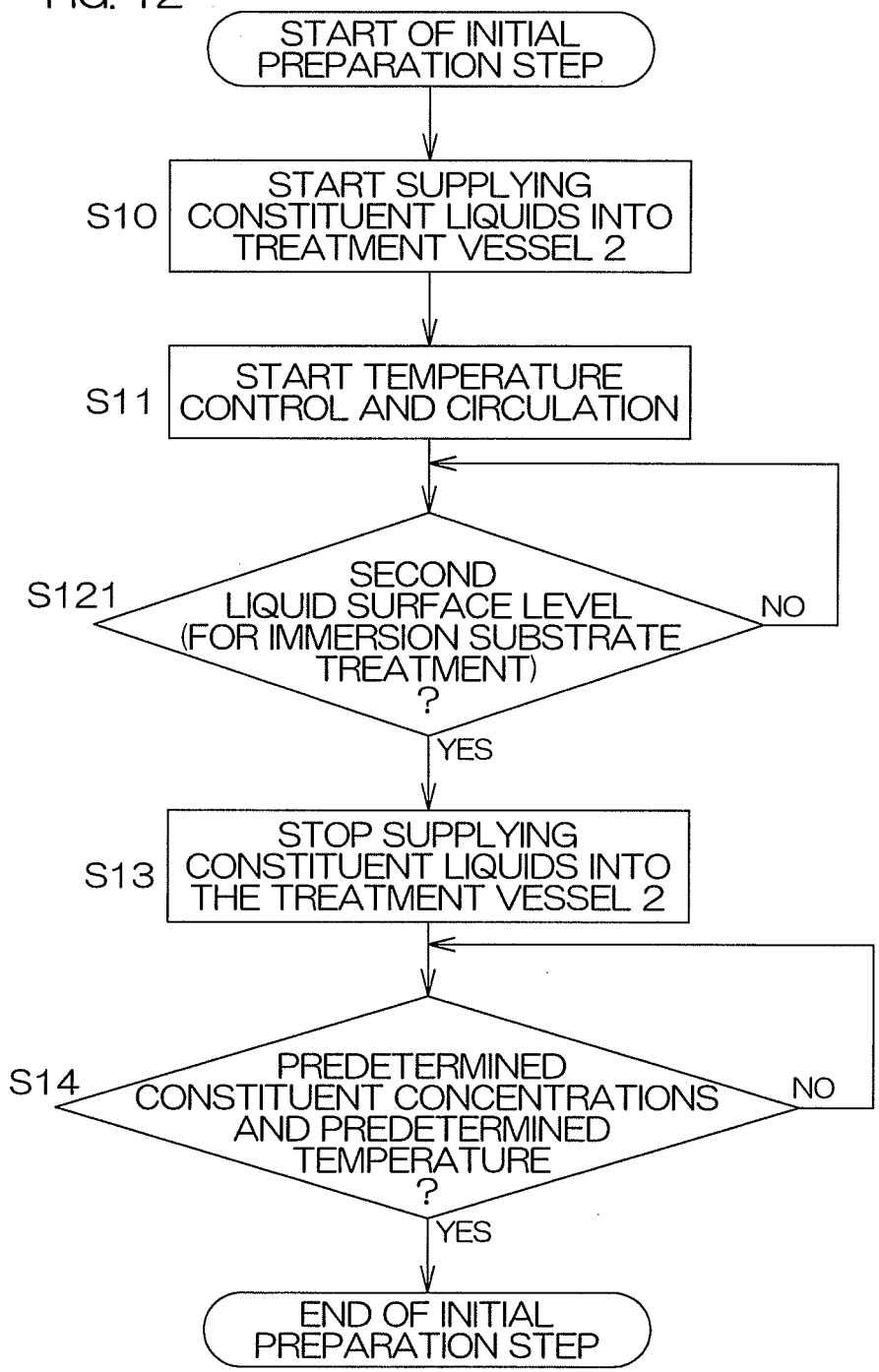
FIG. 12 is a flow chart showing an initial preparation step according to a third embodiment of the present invention.

In this embodiment, as shown in FIG. 12, the control unit 110 supplies the constituent liquids into the treatment vessel 2 (Step S10), and performs the temperature controlling step (Step S11) in the initial preparation step (Step S1).

After Step S11, the control unit 110 checks whether the treatment liquid is retained in the treatment vessel 2 to a predetermined second liquid surface level which permits the surfaces of the substrates W held at the substrate treatment position PP1 to be entirely immersed in the treatment liquid in the treatment vessel 2 (Step S121). The control unit 110 stops supplying the constituent liquids into the treatment vessel 2 (Step S13) when the liquid surface level of the treatment liquid reaches the second liquid surface level (YES in Step S121).

After Step S13, the control unit 110 confirms that the treatment liquid is controlled as having the predetermined constituent concentrations at the predetermined temperature (Step S14), and ends the initial preparation step (Step S1). That is, Step S121 is performed instead of Step S12 shown in FIG. 4 in this embodiment.

Figure 13:
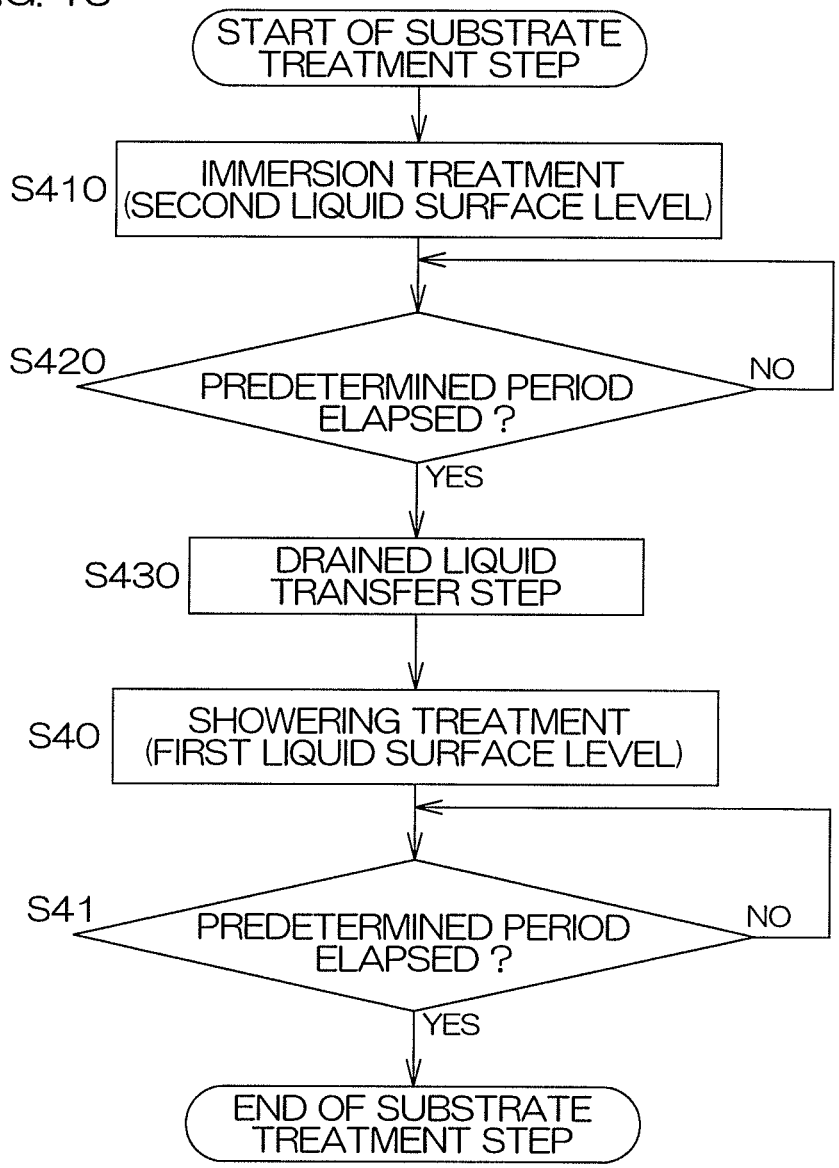
FIG. 13 is a flow chart showing a substrate treatment step according to the third embodiment of the present invention.

In the substrate treatment step (Step S4), as shown in FIG. 13, an immersion substrate treatment is performed in the treatment vessel 2 (Step S410). That is, the substrates W are entirely immersed in the treatment liquid retained in the treatment vessel 2. After confirming that the immersion substrate treatment is performed for a predetermined period of time (Step S420), the control unit 110 performs a drained liquid transfer step (Step S430).

In the drained liquid transfer step (Step S430), the control unit 110 opens the treatment vessel drain valve 49 and the buffer tank bypass valve 36, and drives the pump 6. Thus, the treatment liquid retained in the treatment vessel 2 is drained and rapidly transferred into the buffer tank 100. The transfer of the drained liquid is continued until the liquid surface level of the treatment liquid retained in the treatment vessel 2 is lowered to a liquid surface level below the substrates W so that the substrates W held at the substrate treatment position PP1 do not contact the treatment liquid retained in the treatment vessel 2. When the liquid surface level in the treatment vessel 2 is lowered to reach the predetermined first liquid surface level, the control unit 110 closes the treatment vessel drain valve 49 and the buffer tank bypass valve 36 and stops the pump 6 to end the drained liquid transfer step (Step S430).

Then, the treatment liquid remaining in the treatment vessel 2 is circulated from the treatment vessel 2 to be showered from the nozzles 10 to 17 (first spouting portion) into the treatment vessel, whereby a showering substrate treatment is performed (Step S40). After confirming that the showering treatment has been performed for a predetermined period of time (Step S41), the control unit 110 ends the substrate treatment step (Step S4).

After the showering treatment (Step S40), the substrate unloading step (Step S5) is performed to unload the substrates W out of the treatment vessel 2 and transfer the substrates W to the substrate transport robot.

Figure 14:
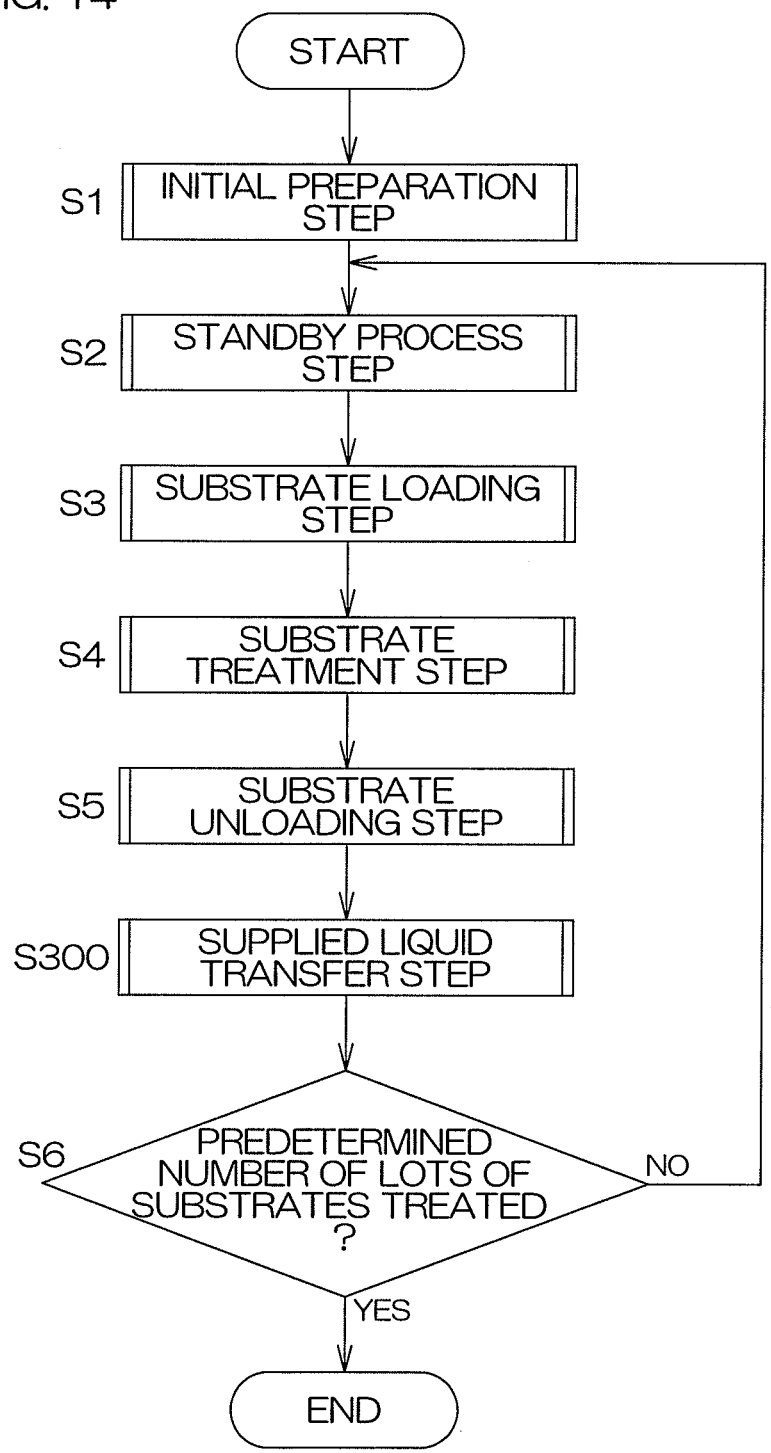
FIG. 14 is a flow chart showing an exemplary overall process sequence according to the third embodiment of the present invention.
Figure 15:
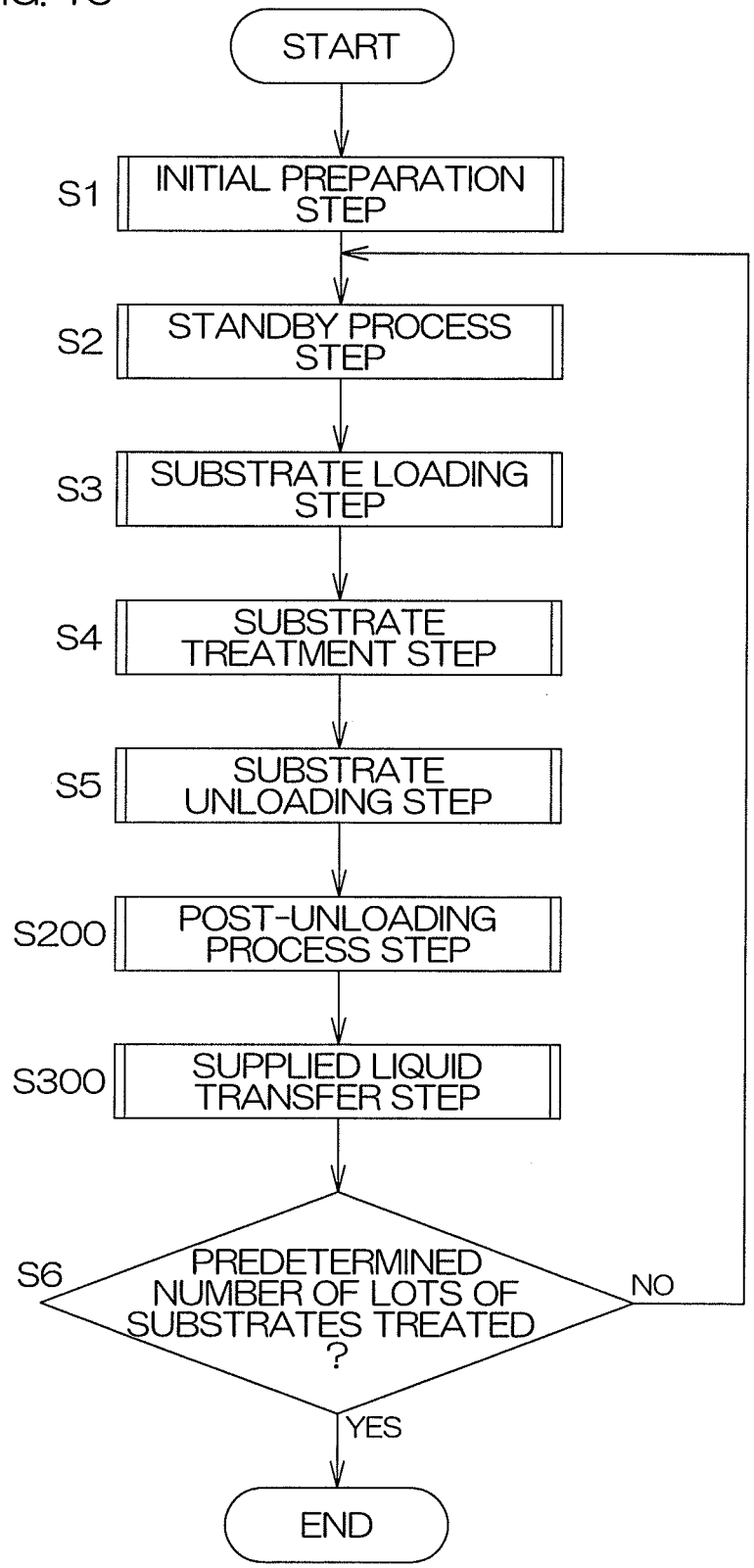
FIG. 15 is a flow chart showing another exemplary overall process sequence according to the third embodiment of the present invention.

After the substrate unloading step (Step S5), as shown in FIG. 14, the supplied liquid transfer step (Step S300) is performed. Where the post-unloading process step (Step S200) is performed after the substrate unloading step (Step S5) as shown in FIG. 15 (in the substrate treatment method of the second embodiment), the supplied liquid transfer step (Step S300) is performed after the post-unloading process step (Step S200).

Figure 16:
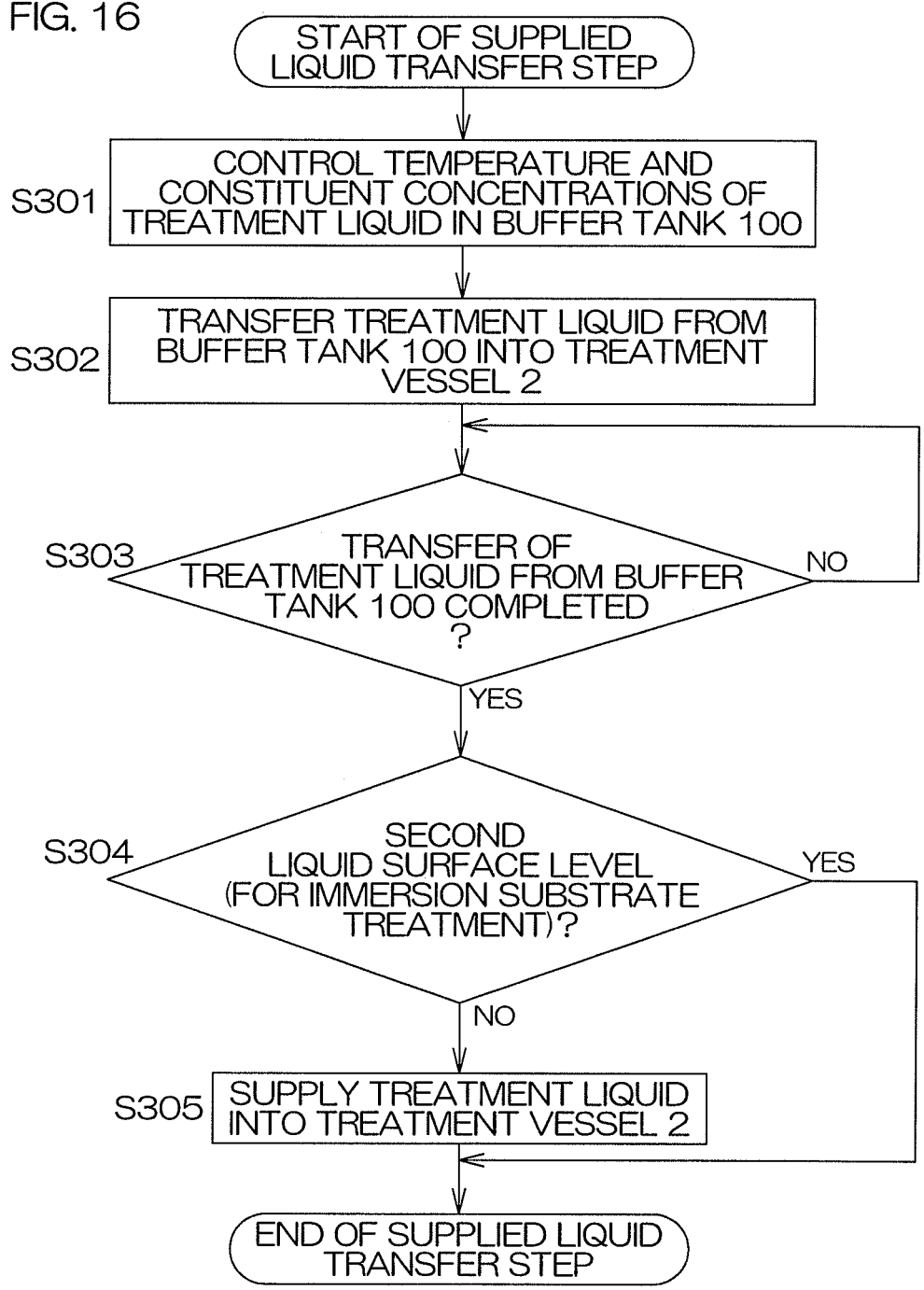
FIG. 16 is a flow chart showing a supplied liquid transfer step according to the third embodiment of the present invention.

Referring next to FIG. 16, the supplied liquid transfer step (Step S300) will be described.

The treatment liquid to be retained in the buffer tank 100 is liable to suffer from the temperature reduction when being transferred from the treatment vessel 2 into the buffer tank 100. Therefore, the treatment liquid transferred into the buffer tank 100 is temperature-controlled in the buffer tank 100 (Step S301). Further, the constituent concentrations of the treatment liquid transferred into the buffer tank 100 are liable to change with time and, therefore, controlled in Step S301.

In Step S301, the temperature and the constituent concentrations of the treatment liquid are controlled in the following manner. That is, the control unit 110 opens the buffer tank drain valve 37 and the buffer tank bypass valve 36, and drives the pump 6. Thus, the treatment liquid is circulated through the buffer tank drain pipe 84, the treatment vessel circulation pipe 79 and the buffer tank liquid feed pipe 83. During the circulation, the temperature of the treatment liquid is measured by the thermometer THP2, and controlled at the predetermined temperature level by the temperature controller 7.

The constituent concentrations of the treatment liquid are measured by the concentration meter CM2. The control unit 110 controls the buffer tank liquid supply valves 33, 34, 35 based on the measured constituent concentrations and target constituent concentrations, whereby the constituent liquids are selectively supplied through the buffer tank liquid supply pipes 63 to 65 to control the constituent concentrations of the treatment liquid.

After Step S301, the control unit 110 opens the nozzle opening/closing valves 40 to 47, and drives the pump 6. Thus, the treatment liquid controlled as having the predetermined constituent concentrations at the predetermined temperature in the buffer tank 100 is transferred from the buffer tank 100 into the treatment vessel 2 through the buffer tank drain pipe 84, the treatment vessel circulation pipe 79 and the nozzles 10 to 17 (first spouting portion) by the pump (Step S302).

When the amount of the treatment liquid retained in the buffer tank 100 is reduced to lower the liquid surface of the treatment liquid to a certain liquid surface level in the buffer tank 100 to make it impossible to feed the treatment liquid by means of the pump 6, the control unit 110 stops the pump 6. Thus, the transfer of the treatment liquid from the buffer tank 100 to the treatment vessel 2 is completed (Step S303).

After Step S303, the control unit 110 determines whether the liquid surface level of the treatment liquid retained in the treatment vessel 2 reaches the predetermined second liquid surface level for the immersion substrate treatment (Step S304). If the liquid surface level of the treatment liquid in the treatment vessel 2 reaches the second liquid surface level, the control unit 110 ends the supplied liquid transfer step (Step S300).

If the predetermined second liquid surface level is not reached (NO in Step S304), the control unit 110 controls the treatment vessel liquid supply valves 30, 31, 32 to supply the constituent liquids into the treatment vessel 2 through the treatment vessel liquid supply pipes 60 to 62 until the predetermined second liquid supply level is reached (Step S305). Thus, the supplied liquid transfer step (Step S300) ends. After the supplied liquid transfer step (Step S300), Step S6 is performed.

In the third embodiment, the showering substrate treatment is performed after the immersion substrate treatment. This makes it possible to effectively utilize the substrate cleaning capability of the immersion treatment, while suppressing the transfer of the particles between different lots of substrates and ensuring more uniform substrate treatment. Further, the treatment liquid used for the immersion treatment is not discarded, but drained to be transferred to the buffer tank 110 for reuse (Step S430). Therefore, the consumption of the chemical liquid can be suppressed.

<Fourth Embodiment>

Figure 17:
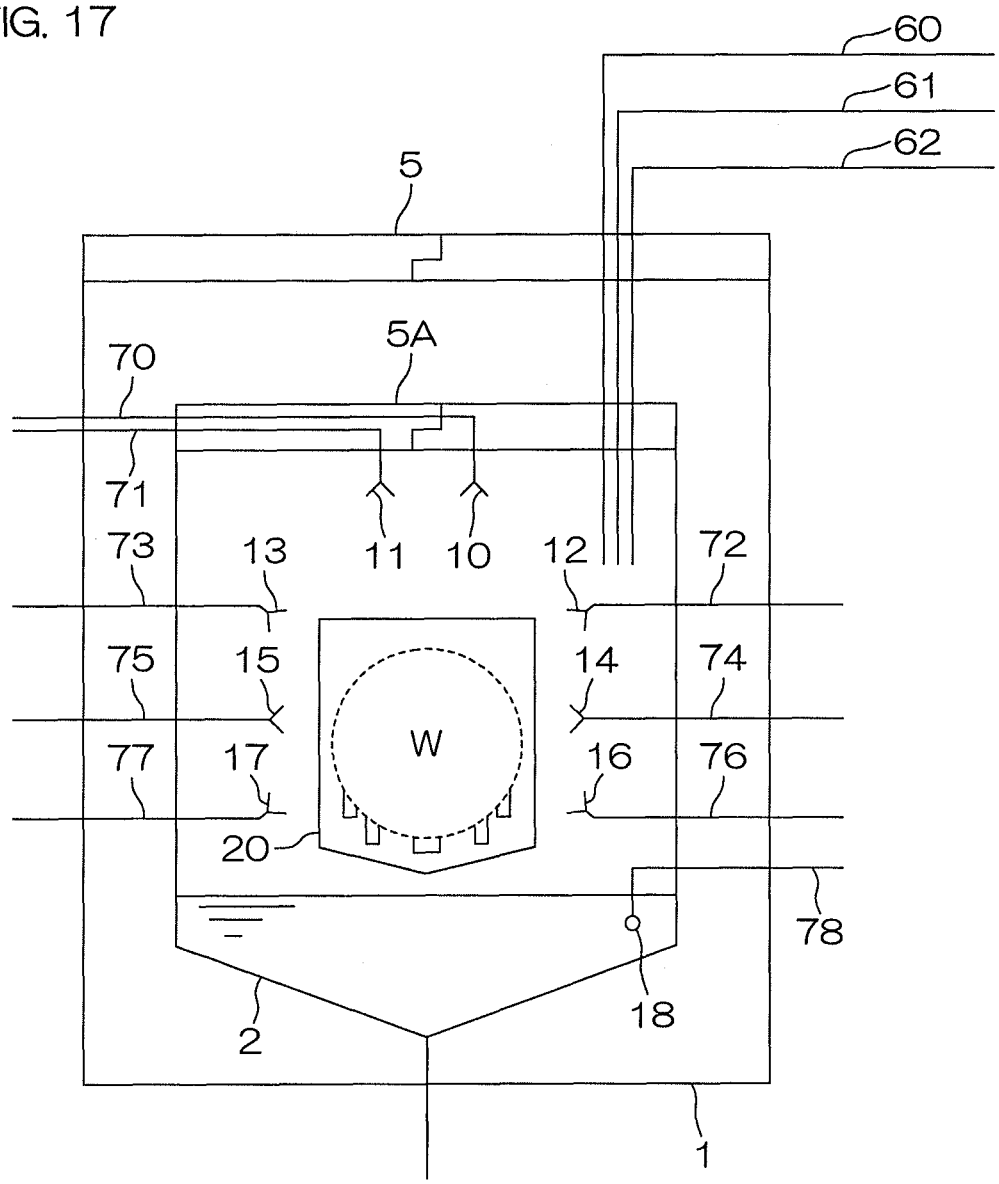
FIG. 17 is a diagram schematically showing the structures of covers of a chamber and a treatment vessel of a substrate treatment apparatus according to a fourth embodiment of the present invention.

Next, a fourth embodiment of the present invention will be described. A substrate treatment apparatus of this embodiment includes a cover 5A provided on the treatment vessel 2 as shown in FIG. 17. The cover 5A is controlled for covering and uncovering the upper opening of the treatment vessel 2 by the control unit 110. In this embodiment, the first nozzles 10, 11 which are provided in the cover 5 of the chamber 1 in the preceding embodiments are provided in the treatment vessel 2.

In FIG. 17, the substrate treatment apparatus is illustrated as including the covers 5, 5A respectively provided on the chamber 1 and the treatment vessel 2, but the cover 5 for the chamber 1 may be obviated.

With the arrangement including the covers 5, 5A respectively provided on the chamber 1 and the treatment vessel 2 as shown in FIG. 17, a double sealed structure can provided in which the internal atmosphere of the chamber 1 and the internal atmosphere of the treatment vessel 2 are individually sealed. Thus, the internal atmosphere of the treatment vessel 2 is less liable to be cooled, and less liable to be affected by the external atmosphere of the chamber 1.

<Fifth Embodiment>

Figure 18:
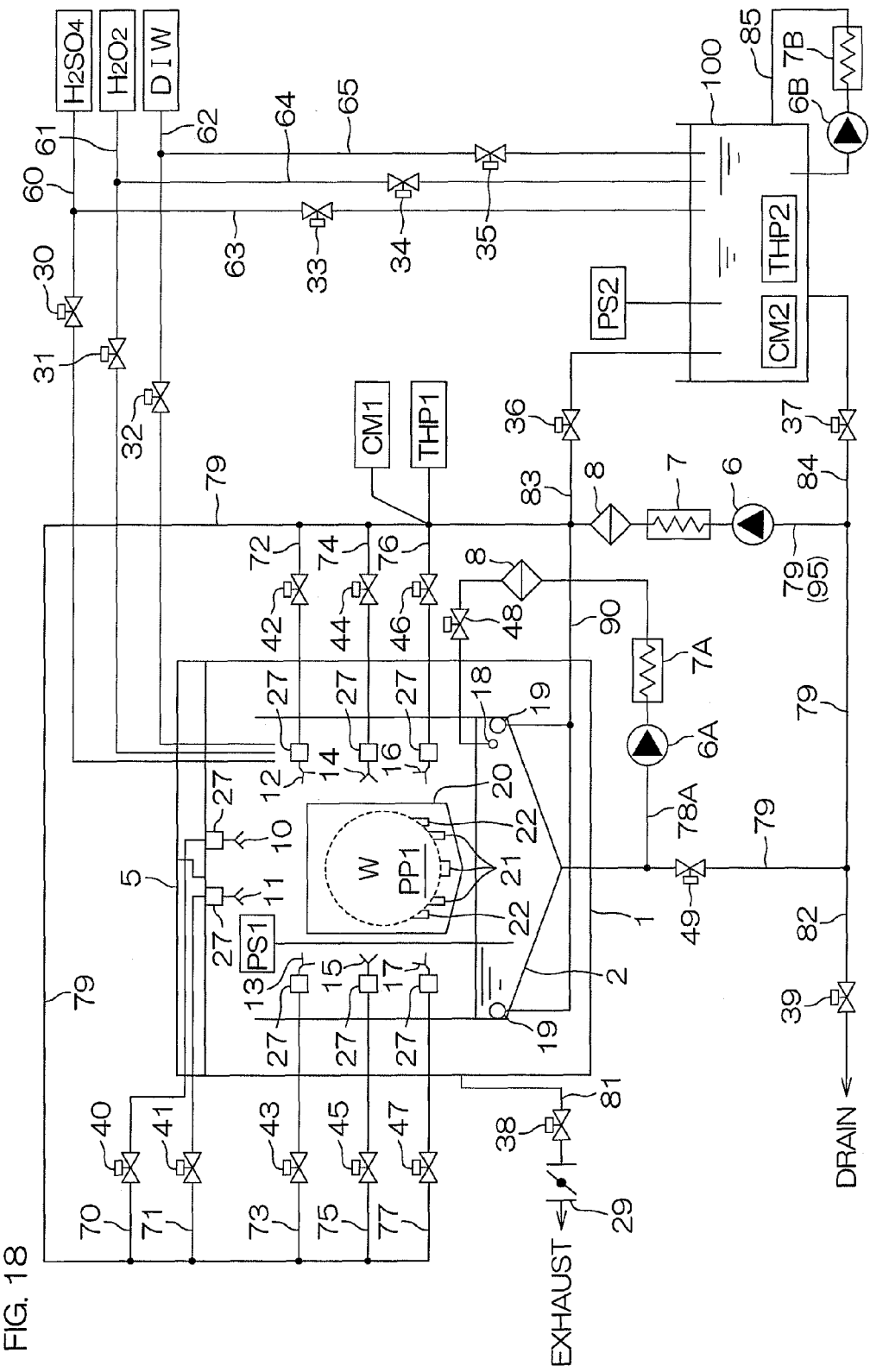
FIG. 18 is a diagram schematically showing the overall construction of a substrate treatment apparatus according to fifth and other embodiments of the present invention.

Next, a fifth embodiment of the present invention will be described. In the preceding embodiments, the first circulation unit (6, 7, 8, 70 to 77, 79) overlaps the second circulation unit (6, 7, 8, 78, 79), so that the common path 95 is shared by the first and second circulation units. In the fifth embodiment, on the other hand, the first circulation unit (6, 7, 8, 70 to 77, 79) and the second circulation unit (6A, 7A, 8A, 78A) are independent of each other as shown in FIG. 18. That is, the second circulation unit includes a treatment vessel bypass pipe 78A connected to the treatment vessel 2 at its opposite ends, and a pump 6A, a temperature controller 7A and a filter 8A provided in this order from the upstream side of the treatment vessel 2 in the treatment vessel bypass pipe 78A. In this embodiment, the treatment vessel bypass pipe 78A is connected at its one end to a part of a drain path defined between the treatment vessel drain valve 49 and the treatment vessel 2.

The first circulation unit (6, 7, 8, 70 to 77, 79) and the second circulation unit (6A, 7A, 8A, 78A) are independent of each other and, therefore, individually operable. When the substrates W are loaded into or unloaded from the treatment vessel 2 with the cover 5 being open, the treatment liquid retained in the treatment vessel 2 can be circulated from the treatment vessel 2 for the temperature control by the second circulation unit (6A, 7A, 8A, 78A) independent of the first circulation unit (6, 7, 8, 70 to 77, 79) with the pump 6 in the first circulation unit stopped. Therefore, the treatment liquid can be temperature-controlled by the second circulation unit even if the first circulation unit needs to be stopped when the cover 5 is open.

When the constituent liquids are additionally supplied into the treatment vessel 2 from the treatment liquid supply pipes 60 to 62, the constituent liquids can be rapidly stirred and mixed together by causing both the first circulation unit and the second circulation unit to circulate the treatment liquid from the treatment vessel 2.

Even if either one of the first and second circulation units is unavailable with its pump 6 or 6A stopped, the treatment liquid retained in the treatment vessel 2 can be circulated from the treatment vessel 2 by the other circulation unit having the operable pump 6, 6A.

Therefore, the constituent liquids supplied into the treatment liquid retained in the treatment vessel 2 can be quickly mixed together so that the treatment liquid is homogenized to have the predetermined constituent concentrations.

<Sixth Embodiment>

Next, a sixth embodiment of the present invention will be described. A substrate treatment apparatus of this embodiment has substantially the same construction as that of the fifth embodiment, except that the filter 8 provided in the first circulation unit and the filter 8A provided in the second circulation unit have different filtering characteristics.

In this case, the treatment liquid preferably flows through the first circulation unit and the second circulation unit at predetermined different flow rates. Thus, the particles present in the treatment vessel 2 can be efficiently trapped by the filters 8, 8A, while the filters 8, 8A are prevented from being clogged.

<Seventh Embodiment>

Figure 19:
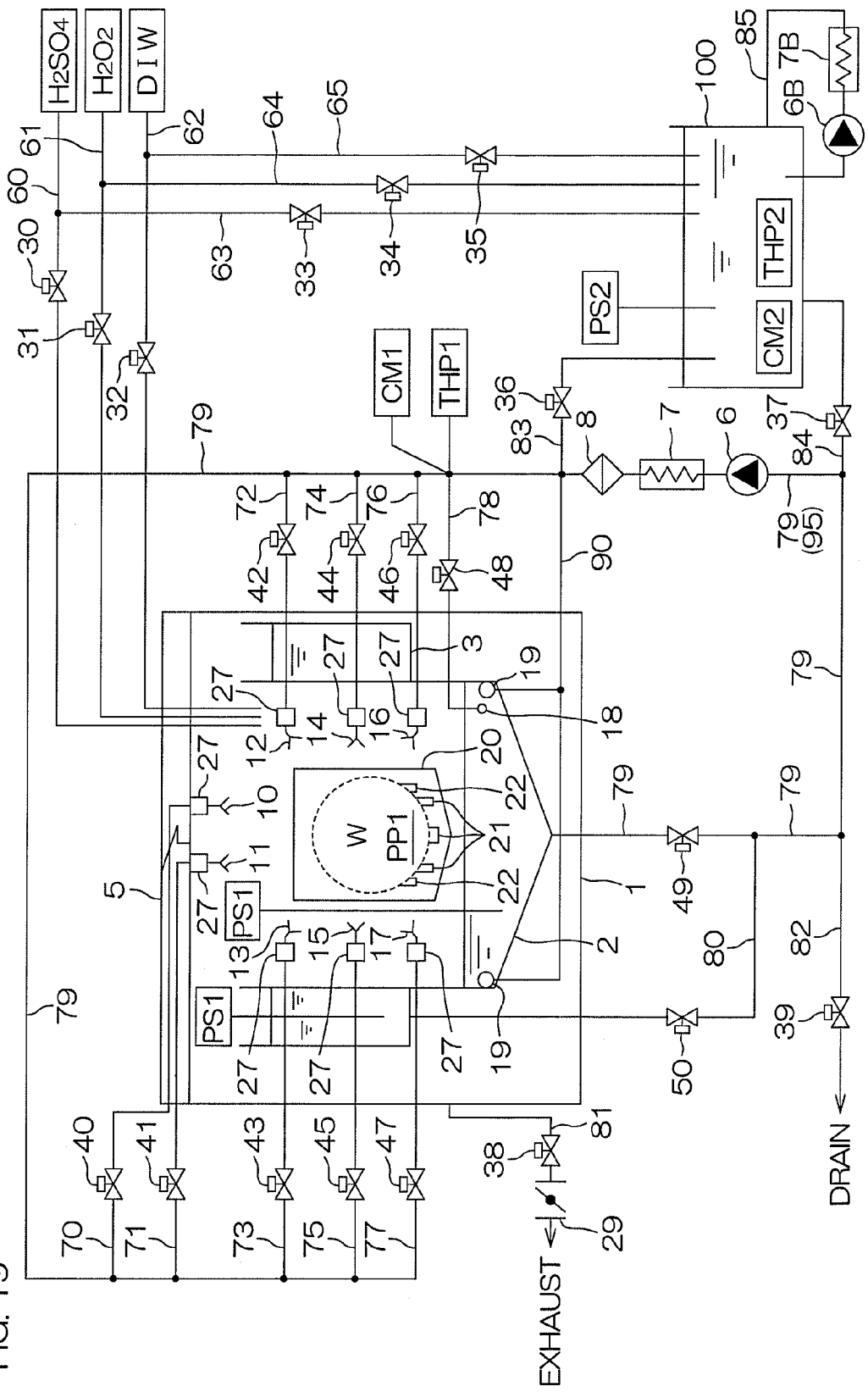
FIG. 19 is a diagram schematically showing the overall construction of a substrate treatment apparatus according to another embodiment of the present invention.

Next, a seventh embodiment of the present invention will be described. In the preceding embodiments, the single pump 6 is time-shared to circulate the treatment liquid from the treatment vessel 2 and to circulate the treatment liquid from the buffer tank 100. On the other hand, the substrate treatment apparatus of this embodiment includes a buffer tank circulation pipe 85 which circulates the treatment liquid only from the buffer tank 100 as shown in FIGS. 18 and 19. Further, an independent pump 6B and an independent temperature controller 7B are provided in the buffer tank circulation pipe 85 for the temperature control of the treatment liquid. That is, a third circulation unit for the circulation of the treatment liquid from the buffer tank 100 is provided independently of the first and second circulation units.

With this arrangement, only the treatment liquid retained in the buffer tank 100 can be circulated from the buffer tank 100 independently of the first circulation unit and the second circulation unit. Thus, the treatment process is more quickly shifted from the showering treatment step to the immersion treatment step. Even if the treatment vessel 2 is used for the substrate treatment, the temperature and the constituent concentrations of the treatment liquid retained in the buffer tank 100 can be controlled independently of the substrate treatment. Therefore, the treatment liquid controlled as having the predetermined constituent concentrations at the predetermined temperature can be additionally supplied into the treatment vessel 2 from the buffer tank 100.

<Other Embodiments>

The present invention is not limited to the embodiments described above, but may be embodied with the following modifications.

In the embodiments described above, a third spouting portion 19 may be provided on the bottom of the treatment vessel 2 as shown in FIGS. 18 and 19.

Where the showering treatment is performed on the substrates W accommodated in the treatment vessel 2, the treatment liquid is supplied through the treatment vessel circulation pipe 79 and the outlet pipes 70 to 77 to be spouted from the nozzles 10 to 17 (first spouting portion). Thus, the substrates W can be effectively treated without re-adhesion of the particles. Where the immersion treatment is performed on the substrates W accommodated in the treatment vessel 2, the treatment liquid is supplied through the treatment vessel circulation pipe 79 and a third spouting portion outlet pipe 90 to be spouted from the third spouting portion 19. Thus, the flow of the treatment liquid retained in the treatment vessel 2 can be properly controlled. This ensures more uniform substrate treatment.

As shown in FIG. 19, the treatment vessel 2 may include an outer vessel 3 which retains a treatment liquid overflowing from the treatment vessel 2, and an outer vessel drain pipe 80 through which the treatment liquid is drained from the outer vessel 3. Then, an outer vessel drain valve 50 which opens and closes a flow path defined in the outer vessel drain pipe 80 may be provided in the outer vessel drain pipe 80. The treatment liquid overflowing from the treatment vessel 2 to be retained in the outer vessel 3 can be fed back into the treatment vessel 2 through the outer vessel drain pipe 80, the treatment vessel circulation pipe 79 and the third spouting portion outlet pipe 90. That is, a fourth circulation unit is provided through which the overflowing treatment liquid is circulated back into the treatment vessel 2. A fourth circulation path which serves as a treatment liquid circulation path of the fourth circulation unit includes the common path 95. Therefore, the pump 6, the temperature controller 7 and the filter 8 provided in the common path 95 are shared by the first, second and fourth circulation units. Of course, the fourth circulation unit may be independent of the first and second circulation units.

According to this embodiment, the treatment liquid retained in the treatment vessel 2 during the immersion treatment is caused to overflow from the treatment vessel 2, so that the particles can be effectively expelled together with the treatment liquid from the treatment vessel 2. The showering treatment and the immersion treatment to be performed in combination provide an excellent synergic effect, so that the substrate treatment can be more uniformly and cleanly performed.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

The present application corresponds to Japanese Patent Application Nos. 2011-068078 and 2012-035298 filed in the Japan Patent Office on Mar. 25, 2011 and Feb. 21, 2012, respectively, the disclosure of which is incorporated herein by reference in entirety.

What is claimed is:

1. A substrate treatment method for treating a substrate with a treatment liquid, the substrate treatment method comprising:
   an initial preparation step of controlling a liquid surface level of a treatment liquid retained in a treatment vessel at a first liquid surface level, and then causing a first circulation unit to circulate the treatment liquid from the treatment vessel through a first circulation path while controlling a temperature of the treatment liquid by a temperature controller disposed in the first circulation path, thereby divergently spouting in air in the treatment vessel the treatment liquid circulated by the first circulation unit and temperature-controlled by the temperature controller from a first spouting portion located above the first liquid surface level, the first liquid surface level being set lower than a lower portion of a substrate held at a substrate treatment position for treatment with the treatment liquid in the treatment vessel so as to prevent the treatment liquid retained in the treatment vessel from contacting the substrate held at the substrate treatment position;
   a substrate loading step of loading the substrate into the treatment vessel from outside thereof and holding the substrate at the substrate treatment position, after the initial preparation step;
   a substrate treatment step of spouting the treatment liquid circulated by the first circulation unit and temperature-controlled by the temperature controller from the first spouting portion located above the first liquid surface level toward the substrate held at the substrate treatment position in air in the treatment vessel while controlling the temperature of the treatment liquid by the temperature controller disposed in the first circulation path; and
   the step of cleaning the treatment liquid by a filter disposed in the first circulation path through which the treatment liquid is circulated by the first circulation unit.

2. The substrate treatment method according to claim 1, further comprising the steps of:
   causing a second circulation unit to circulate the treatment liquid from the treatment vessel back into the treatment vessel through a second circulation path having a second spouting portion provided below the first spouting portion for spouting the treatment liquid in the treatment vessel; and
   cleaning the treatment liquid by a filter disposed in the second circulation path through which the treatment liquid is circulated by the second circulation unit, and controlling the temperature of the treatment liquid by a temperature controller disposed in the second circulation path.

3. The substrate treatment method according to claim 2, wherein the initial preparation step includes the step of causing the first circulation unit or the second circulation unit to circulate the treatment liquid,
   the substrate treatment method further comprising:
   a standby process step of causing the second circulation unit to circulate the treatment liquid from the treatment vessel after the initial preparation step before the substrate loading step;
   wherein the standby process step includes a pre-loading process step of switching a circulation path from the second circulation unit to the first circulation unit to spout the treatment liquid from the first spouting portion into the treatment vessel before the substrate loading step.

4. The substrate treatment method according to claim 2, wherein the initial preparation step includes the step of causing the first circulation unit or the second circulation unit to circulate the treatment liquid,
   the substrate treatment method further comprising:
   a standby process step of causing the second circulation unit to circulate the treatment liquid from the treatment vessel after the initial preparation step before the substrate loading step;
   wherein the standby process step includes a pre-loading process step of causing the first circulation unit and the second circulation unit to circulate the treatment liquid from the treatment vessel to spout the treatment liquid from the first spouting portion and the second spouting portion into the treatment vessel before the substrate loading step.

5. The substrate treatment method according to claim 1, further comprising:
   a substrate unloading step of unloading the substrate from the treatment vessel to outside after the substrate treatment step; and
   a post-unloading process step of causing the first circulation unit to circulate the treatment liquid from the treatment vessel to spout the treatment liquid from the first spouting portion into the treatment vessel immediately after the substrate unloading step.

6. The substrate treatment method according to claim 1, wherein the substrate treatment step includes a treatment region changing step of relatively moving a treatment liquid spouting region to which the treatment liquid is spouted from the first spouting portion in air and a substrate held by a substrate holding unit which holds and moves the substrate in the treatment vessel so as to change a treatment region on the substrate to be treated with the treatment liquid.

* * * * *